US006875273B2

(12) United States Patent
Katamine et al.

(10) Patent No.: US 6,875,273 B2
(45) Date of Patent: Apr. 5, 2005

(54) METHOD AND SYSTEM FOR MANUFACTURING III-V GROUP COMPOUND SEMICONDUCTOR AND III-V GROUP COMPOUND SEMICONDUCTOR

(75) Inventors: Toshihisa Katamine, Satte (JP);
Yasushi Iyechika, Tsukuba (JP);
Tomoyuki Takada, Tsukuba (JP);
Yoshihiko Tsuchida, Tsukuba (JP);
Masaya Shimizu, Tsukuba (JP)

(73) Assignee: Sumitomo Chemical Company, Limited, Osaka (JP)

( * ) Notice: Subject to any disclaimer, the term of this patent is extended or adjusted under 35 U.S.C. 154(b) by 192 days.

(21) Appl. No.: 10/145,713

(22) Filed: May 16, 2002

(65) Prior Publication Data

US 2002/0170484 A1 Nov. 21, 2002

(30) Foreign Application Priority Data

May 30, 2001 (JP) ........................................ 2001-161711
May 30, 2001 (JP) ........................................ 2001-161712
May 17, 2001 (JP) ........................................ 2001-147834

(51) Int. Cl.$^7$ ............................................. C30B 25/14
(52) U.S. Cl. ........................... 117/94; 117/88; 117/81; 117/90; 117/95; 118/715 R; 118/718
(58) Field of Search .................... 117/94, 95, 90, 117/86, 87; 118/715 R, 718

(56) References Cited

U.S. PATENT DOCUMENTS

| | | | | |
|---|---|---|---|---|
| 4,307,681 A | * | 12/1981 | Lampkin et al. | ............ 118/666 |
| 4,464,222 A | * | 8/1984 | Gutsche | ........................ 117/29 |
| 5,097,793 A | * | 3/1992 | Shuhara et al. | ............. 118/715 |
| 5,128,538 A | * | 7/1992 | Genova et al. | ............. 250/251 |
| 5,920,797 A | * | 7/1999 | Ballance et al. | ............. 438/758 |
| 6,100,105 A | | 8/2000 | Katamime et al. | |
| 6,137,231 A | * | 10/2000 | Anders et al. | .......... 315/111.21 |

FOREIGN PATENT DOCUMENTS

EP 0 687 749 A1 12/1995

OTHER PUBLICATIONS

Breiland et al. J. Electrochem. Soc., vol. 138, No. 6, pp. 1806–1816 (1991).
Liu et al., Inst. Phys. Conf. Ser. No. 141: Chapter 2, pp. 119–124, (1995).

* cited by examiner

Primary Examiner—Robert Kunemund
(74) Attorney, Agent, or Firm—Birch, Stewart, Kolasch & Birch, LLP

(57) ABSTRACT

In a semiconductor manufacturing system for manufacturing compound semiconductor by MOCVD, a lead-in member is provided for guiding feed gas supplied from a feed gas supply unit onto the surface of a semiconductor substrate disposed in a reactor, a main body of the lead-in member is constituted as a hollow member to form a feed gas guide passage for conducting the feed gas in an prescribed direction and is formed with multiple orifices, and the feed gas in the feed gas guide passage is jetted from the orifices in a direction perpendicular to the prescribed direction so that the semiconductor substrate is bathed in a feed gas flow of uniform amount jetted from the lead-in member in this manner. Furthermore, a pressure differential produced between the inner side and outer side of the nozzle member enables the feed gas jetted from the nozzle member to flow over the whole surface of the substrate at a uniform flow rate. The multiple feed gases are led to the vicinity of the substrate individually and the blow gas blows the multiple feed gases toward the substrate to favorably from desired thin film crystal.

26 Claims, 19 Drawing Sheets

METHOD AND SYSTEM FOR MANUFACTURING III-V GROUP COMPOUND SEMICONDUCTOR AND III-V GROUP COMPOUND SEMICONDUCTOR

BACKGROUND OF THE INVENTION

1. Field of the Invention

The present invention relates to method and system for manufacturing III–V Group compound semiconductor that enable formation of a crystal growth layer of a thin film compound semiconductor of uniform thickness by vapor deposition and a III–V Group compound semiconductor.

2. Background Art

In the fabrication of various compound semiconductor devices, it is a conventional practice to use a semiconductor single crystal wafer formed by consecutively overlaying required single-crystal layers on a substrate using hydride VPE, which is a process for growing an epitaxial crystal layer using a hydrogen compound such as $AsH_3$ or $PH_3$ in a V Group raw material, metalorganic chemical vapor deposition (MOCVD), which is a process for growing an epitaxial crystal layer by thermally decomposing a metal organic complex, or other such process.

For example, most conventional semiconductor manufacturing systems utilizing the MOCVD process supply the feed gas into the MOCVD reactor through a single supply port. In this conventional technology, the step of conducting the feed gas from the supply port to the substrate placed in the reactor for growth of a single crystal thin-film layer thereon is performed by passing the feed gas over a relatively long distance upstream of the substrate in the reactor so as to obtain a stratified flow of the feed gas having an adequately uniform flow rate and raw material concentration.

On the other hand, there has been developed a reactor that shortens the distance between the raw material supply port and the substrate by using a planar porous plate as the supply port and placing the substrate opposite the porous plate.

In order to achieve a stratified flow of feed gas having a uniform flow rate and desired concentration with the aforesaid conventional configuration, however, it is necessary to pass the feed gas in contact with the wall of the reactor, which is at a high temperature, over a relatively long distance. This entails a number of problems, such as that the crystal purity is degraded because the heat absorbed from the wall causes premature decomposition of the raw material and that the raw material utilization efficiency is degraded.

Moreover, since the feed gas is supplied into the reactor through a single inlet appropriately formed in the reactor, the so-introduced feed gas is liable to experience unbalanced flow because of the nonuniformity of the flow path. This gives rise to various problems, including uneven thickness of the epitaxial crystal layer formed on the semiconductor substrate by the epitaxial vapor deposition. Moreover, when the planar porous plate type of supply port is adopted, regulation of the raw material supply rate within the plane is substantially impossible, making it difficult to make the thickness of the deposited film sufficiently uniform.

In the case of a semiconductor single crystal wafer used to fabricate an LED device, for example, uniform thickness of the epitaxial crystal layers is essential for minimizing wavelength and power characteristic scatter among the LEDs fabricated using the wafer. Owing to such nonuniformity of the deposited layers, however, it is difficult to form LEDs with the same characteristics over the entire semiconductor single crystal wafer. This increases cost because it makes it necessary to establish processes for, for example, checking the characteristics of the fabricated LEDs and sorting them by intended use.

When a required compound semiconductor single-crystal layer is formed by any of these different epitaxial vapor deposition processes, the quality of the epitaxial crystal layer formed strongly affects the properties of the final semiconductor device.

In order to make the thickness of an epitaxial crystal layer formed on a substrate uniform throughout, it is essential to make the flow rate of the feed gas supplied into the reactor uniform over the whole surface of the substrate. This is made difficult by the fact that the substrate mounted on the susceptor in the reactor is controlled to maintain a required growth temperature by, for example, high-frequency induction heating. As this temperature is high, at least around 600° C., the flow of the feed gas introduced into the reactor is disturbed by the heat. It is therefore extremely difficult to achieve uniform flow of the feed gas at the substrate surface. This is particularly true in a high-temperature manufacturing processes involving growth temperatures of 1,000° C. and higher, such as in the case of manufacturing a wafer for GaN-system LEDs.

In the case where individually supplied feed gases are mixed so as to conduct required mixed crystal deposition on a substrate, in order to fabricate III–V Group semiconductor single crystal wafers manufactured by consecutively overlaying required single crystal thin-film layers on a semiconductor or other appropriate substrate, the manufacture of wafers has been carried out using hydride vapor phase epitaxy (HVPE), which is a process for growing an epitaxial crystal layer using a hydrogen compound such as $AsH_3$ or $PH_3$ in a V Group raw material, metalorganic chemical vapor deposition (MOCVD), which is a process for growing an epitaxial crystal layer by thermally decomposing a metal organic complex, or other such process.

When a GaN-based III–V Group compound semiconductor single crystal wafer (e.g., an InGaAlN wafer) is manufactured by one of these methods, a substrate controlled to a proper temperature beforehand is set in a reactor, III Group feed gas, V Group feed gas and feed gas for doping are introduced into the reactor from an external feed gas supply source, and a mixture of these feed gases is fed onto the substrate to conduct the required crystal growth on the substrate.

However, it is known that when III–V Group compound semiconductors are manufactured by HVPE or MOCVD in the foregoing manner, the high temperature (700° C.–1,100° C.) in the reactor causes side-reactions to occur between the V Group material and the metal organic complexes constituting the III Group and/or II Group raw materials before they reach the substrate. For example, side-reactions caused by premature decomposition occur between the III Group raw material trimethyl indium (TMIn) and the V Group raw material phosphine ($PH_3$) and between the III Group raw material trimethyl gallium (TMGa) and the V Group raw material ammonia ($NH_3$).

When side-reactions occur between different III–V Group feed gases in this manner in the case of forming mixed crystal composed of GaN crystal and AlN crystal, the composition of the produced crystal thin film does not match the intended composition because the trimethyl aluminum (TMAl) supplied as AlN material and the bis-ethyl-cyclopentadienyl-magnesium (($EtCp)_2Mg$) supplied as dopant are consumed by side-reactions. In addition, a problem of marked decrease in the crystal deposition rate arises. When side-reactions occur, moreover, the products of the side-reactions act as nuclei that give rise to abnormal particle growth on the substrate. As this degrades crystal quality, it becomes difficult to ascertain conditions for stable and effective growth of thin-film crystal layers on the substrate, thus causing still another problem.

Further, since the side-reactions slow the rate of crystal deposition, the crystal films produced become thin. Also or instead, the products of the side-reactions deposit in large amounts at the upstream side of the reactor. This increases maintenance costs owing to the time and effort that have to be spent for the frequently required removal of the deposits.

A conventional method adopted when, for example, manufacture of high quality thin-film crystal layers is required has therefore been to suppress occurrence of side-reactions before thin-film crystal deposition by supplying the feed gases onto the substrate in the reactor individually as required.

However, when different kinds of feed gas are individually supplied onto a semiconductor or other substrate, the mixing of the supplied feed gases is insufficient. This leads to various inconveniences, such as that thin-film crystal of desired composition cannot be deposited to the prescribed thickness. In the deposition of GaN-based thin-film crystal, for example, insufficient mixing of the feed gases of course slows the deposition rate and, in addition, causes the mixed crystal to have lower content of Al, In and other III Group elements aside from Ga and, in the case of adding a II Group element as dopant, reduces the crystal deposition rate and/or decreases the efficiency of the II Group element incorporation.

SUMMARY OF THE INVENTION

An object of the present invention is to provide a compound semiconductor manufacturing system and a method of manufacturing compound semiconductor that overcome the foregoing problem points of the prior art and to provide a compound semiconductor having a semiconductor thin film layer(s) of high quality.

Another object of the present invention is to provide a compound semiconductor manufacturing system and a method of manufacturing compound semiconductor that are able to supply feed gas onto a substrate so as to form a high quality semiconductor thin film layer.

A further object of the present invention is to provide a compound semiconductor manufacturing system and a method of manufacturing compound semiconductor that are able to supply feed gas onto a substrate without the occurrence of an unbalanced flow.

A further object of the present invention is to provide a compound semiconductor manufacturing system and a method of manufacturing compound semiconductor that are able to supply feed gas onto a substrate without the occurrence of premature decomposition.

A further object of the present invention is to provide a compound semiconductor manufacturing system and a method of manufacturing compound semiconductor that are able to supply feed gas onto a substrate in such a way that multiple of feed gases are fully mixed.

A further object of the present invention is to provide a compound semiconductor manufacturing system and a method of manufacturing compound semiconductor that are able to supply uniform flow of multiple feed gases onto a substrate in such a way that the multiple of feed gases are fully mixed.

Based on results obtained through in-depth studies on the feed gas supply system conducted with a view to overcoming the foregoing problems, the inventors discovered that these problems can be solved by modifying the raw material supply to establish a raw material supply system differing from that of the prior art. The present invention was accomplished as a result.

The present invention overcomes the disadvantages of the prior art by providing a semiconductor manufacturing system for manufacturing compound semiconductor by MOCVD, wherein a lead-in member for guiding feed gas supplied from the exterior onto the surface of a semiconductor substrate disposed in a reactor is constituted as a hollow member and the feed gas is jetted from the hollow member in a uniform amount in a direction substantially perpendicular to the direction in which the flow of feed gas is guided within the hollow member, so that the semiconductor substrate is bathed in the feed gas flow of uniform amount jetted from the lead-in member.

In another aspect, the present invention provides a compound semiconductor manufacturing system equipped with a feed gas supply unit and a reactor for receiving feed gas from the feed gas supply unit and forming a thin-film crystal layer on a semiconductor substrate by metalorganic chemical vapor deposition, the semiconductor manufacturing system being characterized in comprising: a lead-in member provided in the reactor for feeding the feed gas received from the feed gas supply unit onto the surface of the semiconductor substrate, which lead-in member includes a void-like guide passage for conducting the feed gas from the feed gas supply unit in a prescribed first direction and a gas nozzle for jetting the feed gas from the void-like guide passage in a second direction substantially perpendicular to the first direction, the semiconductor substrate being bathed in the flow of feed gas from the gas nozzle.

According to this compound semiconductor manufacturing system for manufacturing compound semiconductor described above, the use of the lead-in member consisting of an appropriate hollow member enables supply of the feed gas onto the semiconductor substrate from an aperture or apertures that constitute a gas nozzle and are formed in a hollow member of bar-like or annular shape. Thus, by effecting crystal growth with the substrate placed to be bathed in the flow of gas supplied from the nozzle, highly uniform crystal growth can be achieved. The lead-in member can be easily cooled by a cooling means. Since this enables the feed gas supply ports to be brought closer to the crystal growth site than possible with a conventional system, the feed gas can be temperature controlled and brought to the crystal growth site in a fresher state than heretofore, thereby enhancing the crystal purity and improving the raw material utilization efficiency.

In another aspect, the present invention provides a compound semiconductor manufacturing system equipped with a reactor and a feed gas supply unit and capable of manufacturing compound semiconductor by an epitaxial vapor deposition process by using a nozzle unit installed in the reactor to discharge feed gas from the feed gas supply unit toward a surface of a substrate mounted in the reactor, the semiconductor manufacturing system being characterized in that a pressure differential is produced between the inner side and outer side of a feed gas nozzle member of the nozzle unit. According to the foregoing manufacturing system, a pressure differential produced between the inner side and outer side of the feed gas nozzle member of the nozzle unit for feeding the feed gas toward the surface of a substrate mounted in the reactor enables the feed gas jetted from the nozzle unit to flow over the substrate surface at a uniform flow rate.

The present invention in further aspect provides a method for manufacturing III–V Group compound semiconductor by introducing multiple kinds of feed gas into a reactor in which a substrate on which thin-film crystal layers are to be formed has been mounted and depositing thin-film crystal layers on the substrate by hydride vapor phase epitaxy or metalorganic chemical vapor deposition, which method is characterized in comprising the steps of leading the multiple feed gases to the vicinity of the substrate individually and using a blow gas separately led into the reactor to mix the multiple feed gases present in the vicinity of the substrate and then blow the mixed feed gases toward the substrate.

Since the multiple feed gases are led individually to the vicinity of the substrate, they reach the vicinity of the substrate in the proper state without prematurely decomposing and giving rise to side-reactions before arriving at the substrate. The multiple feed gases reaching the vicinity of the substrate in this manner are blown toward the substrate by the blow gas and, therefore, at this time mix for the first time and come in contact with the surface of the substrate. As a result, the desired thin-film crystal can be favorably deposited on the surface of the substrate.

In further aspect, the present invention provides a system for manufacturing III–V Group compound semiconductor that is adapted to introduce multiple kinds of feed gas into a reactor in which a substrate has been mounted and form thin-film crystal layers on the substrate by hydride vapor phase epitaxy or metalorganic chemical vapor deposition, which system is characterized in comprising a lead-in member provided in the reactor for introducing the multiple feed gases into the reactor and leading them to the vicinity of the substrate individually and for leading a blow gas supplied from outside the reactor to the vicinity of the substrate, and a blow member provided at an outlet of the lead-in member for, after the multiple feed gases exiting the lead-in member have been mixed by the blow gas, blowing the blow gas onto the multiple feed gases to blow them toward the substrate.

This invention will be better understood and other objects and advantages thereof will be more apparent from the following detailed description of preferred embodiments with reference to the accompanying drawings.

DESCRIPTION OF THE PREFERRED EMBODIMENTS

Figure 1:
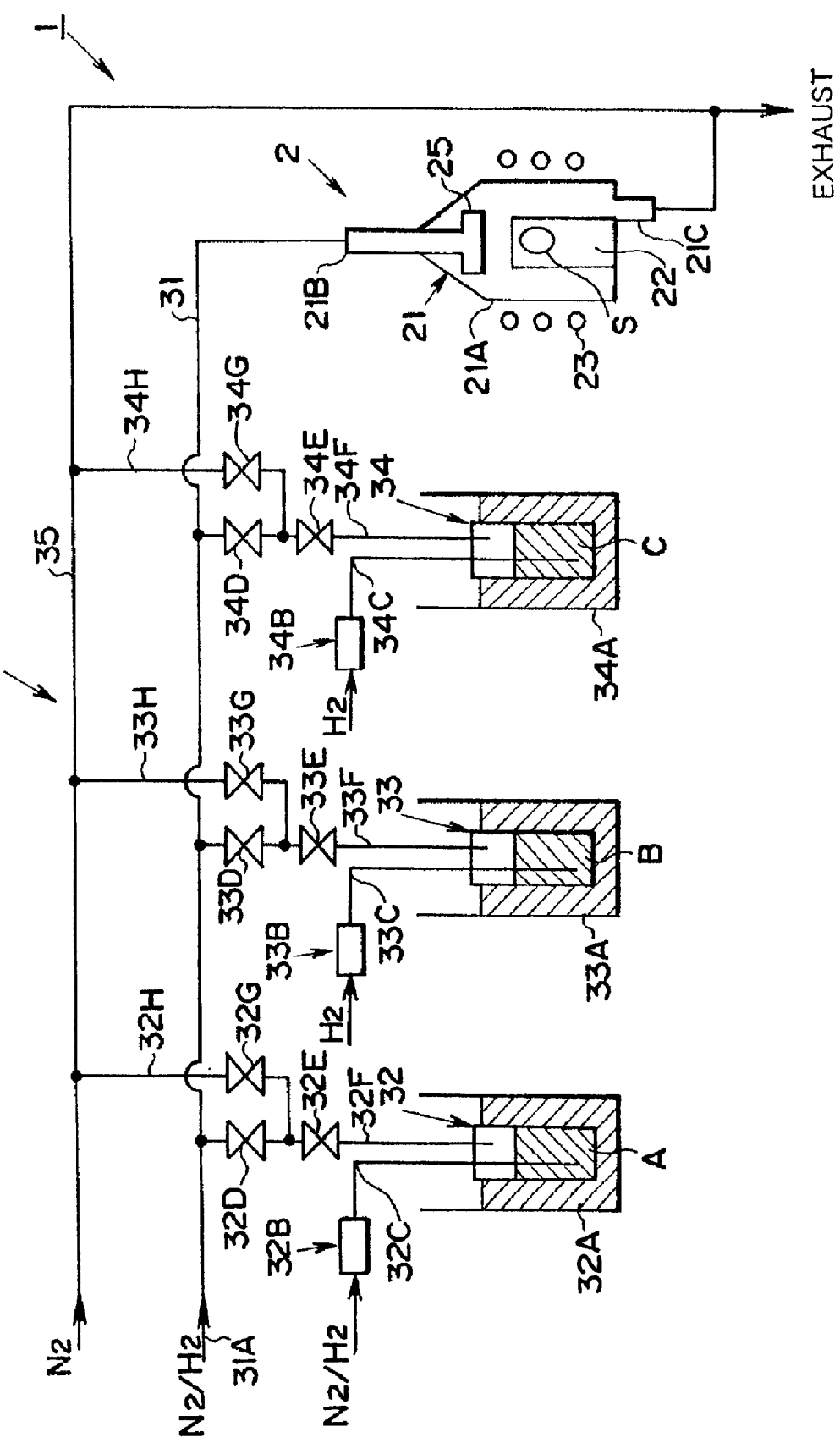
FIG. 1 is a schematic diagram showing a semiconductor manufacturing system that is an embodiment of the present invention.

FIG. 1 is a schematic diagram showing a semiconductor manufacturing system that is an embodiment of the present invention. The semiconductor manufacturing system 1 is a system for manufacturing a suitable compound semiconductor wafer such as, for instance, a GaN-based III–V Group compound (e.g., InGaAlN) semiconductor or a GaAs-based III–V Group compound semiconductor wafer. It is equipped with a reactor 2 and a feed gas supply unit 3 for supplying feed gas to the reactor 2.

The reactor 2 comprises a main body 21 and, inside the main body 21, a susceptor 22 on which a substrate S is set. The susceptor 22 is heated by a high-frequency induction heating coil 23 provided on the outer surface 21A of the main body 21, to which a heating current is supplied from a heating power source (not shown). The high-frequency induction heating coil 23 heats the susceptor 22, to make the substrate S to a required temperature.

The feed gas supply unit 3 is equipped with a feed gas supply line 31 for feeding raw materials in vapor phase to an inlet port 21B of the main body 21. Carrier gas is supplied into an input end 31A of the feed gas supply line 31 from gas supply source (not shown) at a constant pressure. The feed gas supply line 31 is connected with bubblers 32, 33, 34 that vaporize the raw materials for vapor deposition on the substrate S and feed the vaporized materials to the feed gas supply line 31. In FIG. 1, supply lines for raw materials having a large vapor pressure, which need simpler construction of supply line than those for raw materials in liquid state or solid state, are not shown.

The temperature of the bubbler 32 is regulated by a thermostatic bath 32A. Carrier gas fed through a pipe 32C at a flow rate controlled by a mass flow controller 32B is charged into a raw material A contained in the bubbler 32 to foam and thus vaporize the raw material A. The bubbler 32 and the feed gas supply line 31 are interconnected through a pipe 32F provided with a shut-off valve 32D and a flow rate control valve 32E connected in series. When the shut-off valve is opened, a mixed gas composed of vapor-state raw material produced in the bubbler 32 and carrier gas is fed into the feed gas supply line 31 as feed gas at an adjusted flow rate. The so-fed gas is led into the main body 21 through the feed gas supply line 31 as explained later.

An exhaust gas pipe 32H provided with another shut-off valve 32G is connected between an exhaust gas line 35 supplied with nitrogen at a prescribed pressure and the connection point of the shut-off valve 32D and flow rate control valve 32E. When the shut-off valve 32D is closed, the feed gas from the flow rate control valve 32E can escape into the exhaust gas line 35. The opening/closing of the shut-off valves 32D, 32G is controlled by a process control unit (not shown) so that when one is closed the other is open. This makes it possible to feed gas from the flow rate control valve 32E into the feed gas supply line 31 for prescribed time periods at prescribed timing.

The bubblers 33, 34 for vaporizing raw materials B and C are identical in structure with the bubbler 32. The components of the bubblers 33, 34 corresponding to the components 32A–32H of the bubbler 32 are assigned reference symbols 33A–33H and 34A–34H, respectively, and no explanation will be made regarding them.

Each of the feed gases produced in the bubblers 32, 33, 34 in the foregoing manner is fed out at a prescribed pressure controlled by the associated flow rate control valve. The amounts of the feed gases required for forming the individual thin-film layers can be fed into the main body 21 at the required times by controlling the opening of the shut-off valves 32D, 32G, 33D, 33G, 34D, 34G and the opening/closing of the associated shut-off valves 32D, 33D, 34D. The feed gases are passed into the main body 21. Upon being fed into the main body 21, the feed gases are thermally decomposed near the surface of the substrate S to cause growth of epitaxial crystal on the substrate S. The used feed gas is sent from a discharge port 21C to the waste gas treater.

Figure 2:
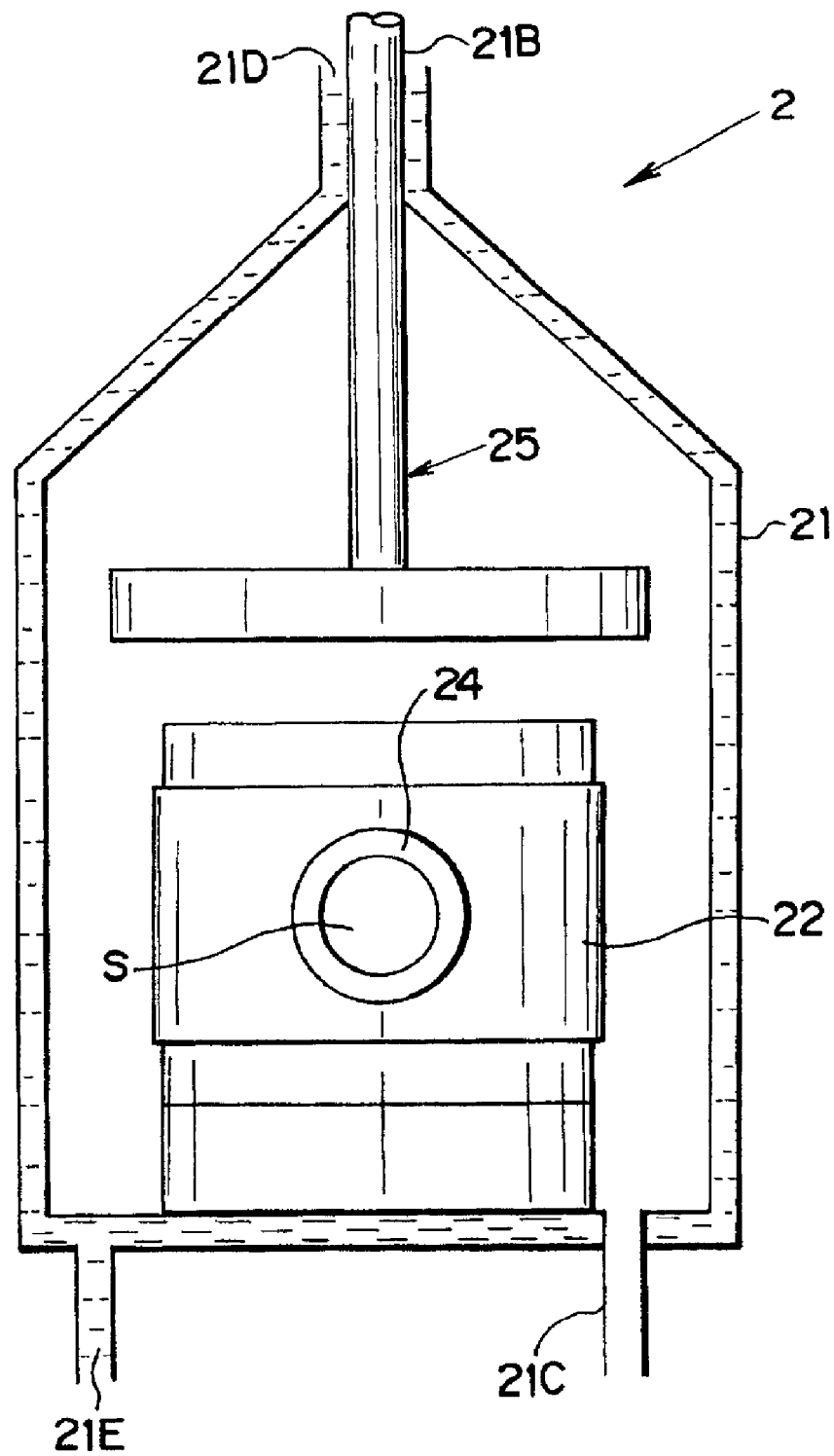
FIG. 2 is an enlarged sectional view showing the details of the reactor of FIG. 1.

FIG. 2 is an enlarged view of the reactor 2 shown in FIG. 1 illustrating its structural details. The main body 21 has a double wall structure and is water cooled. Specifically, coolant supplied through a coolant supply port 21E provided at the top of the main body 21 cools the whole outer surface of the main body 21 and is discharged from a coolant discharge port 21D.

The substrate S is mounted on the susceptor 22 by a substrate holder 24. In the arrangement shown in FIG. 2, only one substrate S can be processed at a time. However, the susceptor 22 can be replaced by another that is capable of mounting multiple substrates S by the same method of attachment. The inlet port 21B is connected with a nozzle unit 25 for leading the feed gas arriving from the feed gas supply unit 3 into the main body 21 and supplying it at a uniform flow rate over the whole surface of the substrate S in order to form an epitaxial crystal layer.

Figure 3:
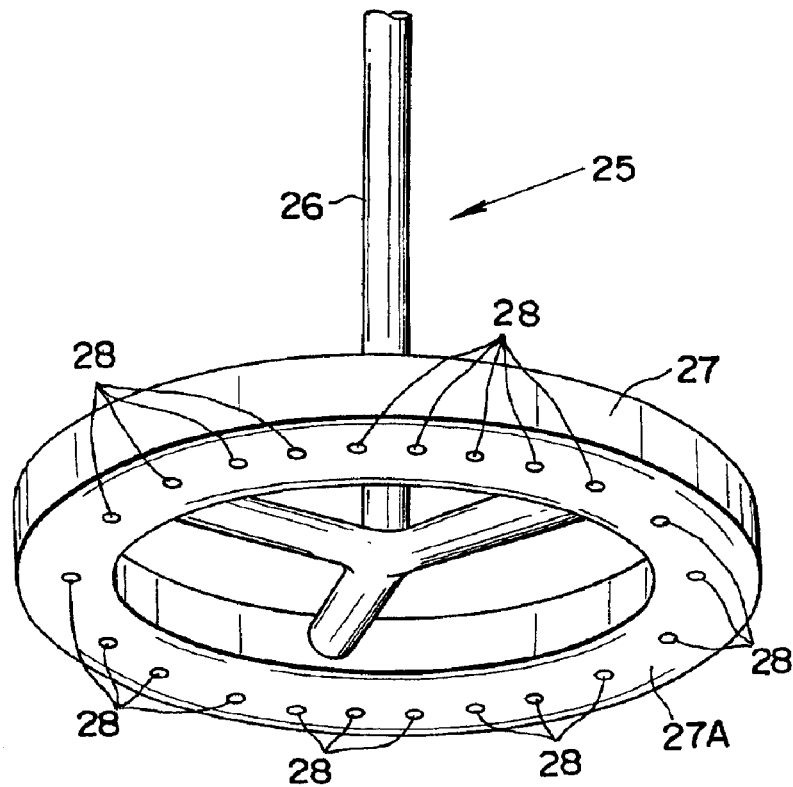
FIG. 3 is an enlarged perspective view of the nozzle unit of FIG. 2.

As shown in FIG. 3, the nozzle unit 25 is composed of an inlet pipe member 26 for leading in feed gas and a hollow annular nozzle member 27 provided at the downstream end of the inlet pipe member 26. A bottom wall 27A of the nozzle member 27 is a perforated plate formed with many relatively small diameter orifices 28.

Owing to this structure, the feed gas flowing in through the inlet pipe member 26 is throttled at the orifices 28 of the bottom wall 27A so that a pressure differential occurs between the inner side and outer side of the nozzle member 27. Since the outflow pressure of the discharged feed gas is therefore substantially the same at all orifices 28, the flow of the feed gas at the substrate S mounted on the susceptor 22 is uniform. As a result, the thickness of the epitaxial crystal layer formed on the substrate S is substantially identical over the whole surface of the substrate S.

In the configuration shown in FIG. 3, the perforated plate configured by forming many orifices 28 in the bottom wall 27A of the nozzle member 27 is used to produce a pressure differential in the feed gas between the inner side and outer side of the nozzle member 27. It is, however, possible to use some other means for establishing such a pressure differential.

Figure 4:
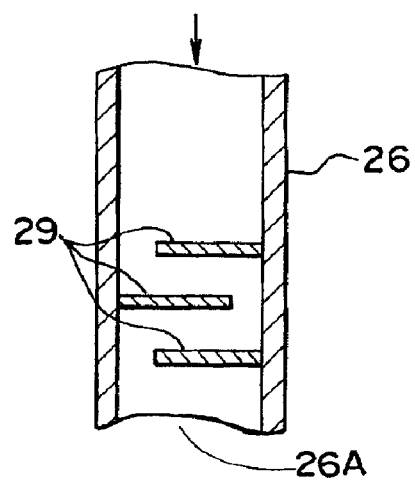
FIG. 4 is a sectional view of the structure of a pressure differential producing mechanism utilizing baffle plates to produce a pressure differential.

FIG. 4 shows a configuration that produces the required pressure differential between the inner side and outer side of the nozzle unit 25 by providing baffle plates in the flow path of the feed gas in the nozzle unit 25. In this pressure differential producing mechanism, multiple baffle plates 29 are disposed in the inlet pipe member 26 in an alternating arrangement as illustrated. This structure produces the required pressure differential by imparting flow resistance to the feed gas flowing inside the nozzle unit 25. The feed gas jetted from an outlet 26A of the inlet pipe member 26 can be directly supplied to the surface of the substrate S when the multiple baffle plates 29 are disposed. An appropriate nozzle member may be provided with the outlet 26A to spread the feed gas on the surface of the substrate S.

The pressure differential producing mechanism using the baffle plates 29 and the pressure differential producing mechanism using the perforated plate formed at the bottom wall 27A of the nozzle member 27 can be used in combination.

In the configuration of FIG. 3, a perforated plate obtained by forming many orifices 28 in the bottom wall 27A of the nozzle member 27 is used to produce a difference in the pressure of the feed gas between the inner side and outer side of the nozzle member 27. Two or more perforated plates of this type can be provided at the bottom portion the nozzle member 27.

Figure 5:
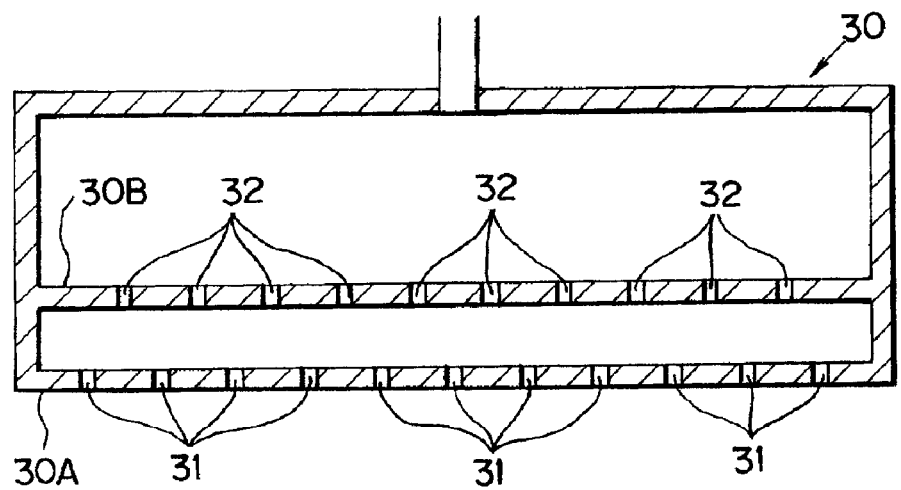
FIG. 5 is a sectional view showing an example of a configuration in which multiple perforated plate stages are provided.

FIG. 5 shows an example of a configuration of a nozzle member having a plurality of perforated plates of this type installed at the bottom portion thereof. A nozzle member 30 shown in FIG. 5 has an outside bottom member 30A provided with a number of orifices 31 of a relatively small size to form a perforated plate, and an inside bottom member 30B is provided in the nozzle member 30 separate from the outside bottom member 30A. A plurality of orifices 32 are formed in the inside bottom member 30B and the orifices 32 are offset relative to the orifices 31 of the outside bottom member 30A so as not to align with them. This provision of a second-stage perforated plate increases the pressure differential and raises the uniformity of the flow rate to a still higher level than when only one stage is provided.

The provision in the nozzle unit 25 of a mechanism for producing a pressure differential makes it possible to feed the feed gas at a uniform flow rate over the whole surface of the substrate S and this in turn enables the epitaxial crystal layer formed on the surface of the substrate S to be made uniform over the whole surface of the substrate S. Therefore, LEDs or other semiconductor devices fabricated using a semiconductor single crystal wafer manufactured by successively forming required epitaxial crystal layers on a substrate S in this manner are uniform devices with little scatter in their characteristics. In the case of LEDs, therefore, uniformity in luminance and wavelength is ensured and irregularity in these characteristics can be effectively suppressed.

EXAMPLE 1

Figure 6:
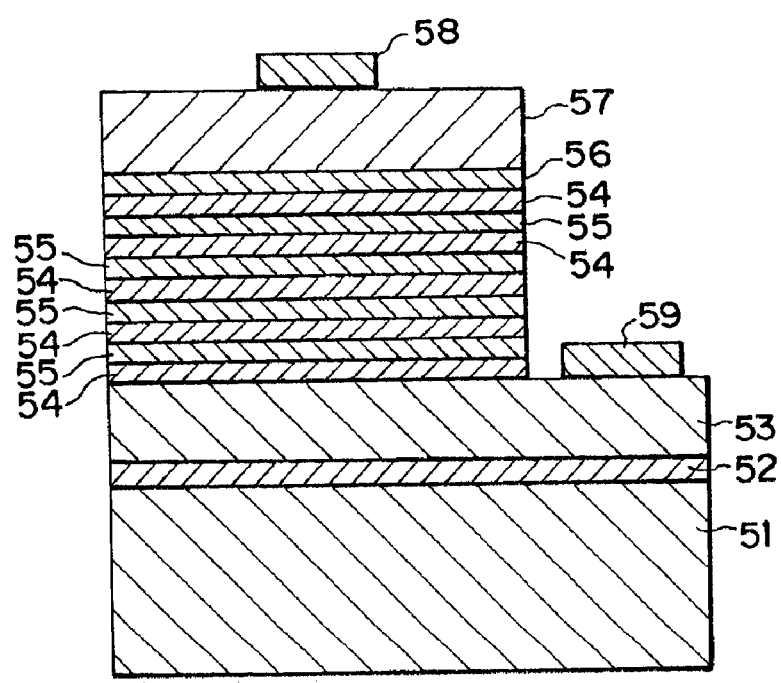
FIG. 6 is a sectional view showing the structure of a light emitting device manufactured using the semiconductor manufacturing system of shown in FIG. 1.

A light-emitting device was fabricated using the semiconductor manufacturing system 1 explained in the foregoing. The light-emitting device had the structure shown in FIG. 6. In this figure, 51 is a substrate, 52 is a GaN buffer layer, 53 is a Si-doped high-temperature GaN layer, 54 is a Si-doped low-temperature GaN layer, 55 is an InGaN layer, 56 is an AlGaN layer, 57 is a Mg-doped GaN layer, 58 is a p electrode, and 59 is an n electrode. The III–V Group compound semiconductors were produced by metalorganic chemical vapor deposition.

Silane ($SiH_4$) diluted with nitrogen was used as an n-type dopant for Si doping and bis-ethil-cyclo-pentadienyl-magnesium (($C_2H_5C_5H_4)_2Mg$; hereinafter called $(EtCp)_2Mg$) was used as a p-type dopant for Mg doping.

Sapphire whose C-face had been polished to a mirror finish was washed with an organic solvent and used as the substrate 51. A susceptor capable of processing a single two-inch substrate was used. It was rotated during film deposition. The nozzle of the reactor was equipped with the two-stage perforated plate structure shown in FIG. 5 for imparting a pressure differential and establishing uniform gas flow.

The reactor and the substrate were first cleaned by feeding in hydrogen chloride gas at 1,100° C. using hydrogen as carrier gas. At completion of cleaning, TMG and ammonia were fed at a substrate temperature of 550° C. to form the GaN buffer layer 52 to a thickness of 50 nm.

The substrate temperature was raised to 1,040° C. and trimethyl gallium (($CH_3)_3Ga$; hereinafter sometimes called TMG), ammonia and silane gas were supplied to grow the GaN layer 53 to a thickness of 3 μm. The GaN layer was doped with Si to have an n-type carrier concentration of $1 \times 10^{18}/cm^3$. A non-doped GaN layer (not shown) was then grown to a thickness of 150 nm at the same temperature. The deposition rate of the Si-doped and non-doped layers was 50 nm/min.

The substrate temperature was lowered to 775° C., the carrier gas was switched to nitrogen, and triethyl gallium (($C_2H_5)_3Ga$; hereinafter sometimes called TEG), ammonia and silane gas were supplied to grow the Si-doped GaN layer 54 to a thickness of 17 nm. Next, TEG, trimethyl indium (($CH_3)_3In$; hereinafter sometimes called TMI) and ammonia were supplied to deposit the InGaN layer 55, the light-emitting layer, to a thickness of 3 nm. The foregoing deposition of GaN and InGaN layers was repeated four times.

TEG, trimethyl aluminum (($CH_3)_3Al$; hereinafter sometimes called TMA) and ammonia were supplied to deposit the AlGaN layer 56, a protective layer, to a thickness of 6 nm.

Thus obtained epitaxial wafer was once removed from the reactor, and was returned to the reactor, then deposited with a Mg-doped AlGaN layer, a protective layer, to a thickness of 44 nm. The substrate temperature was then raised to 1,060° C. and the Mg-doped GaN layer 57 was deposited to a thickness of 200 nm by supplying TMG, $(EtCp)_2Mg$ and ammonia.

Figure 7:
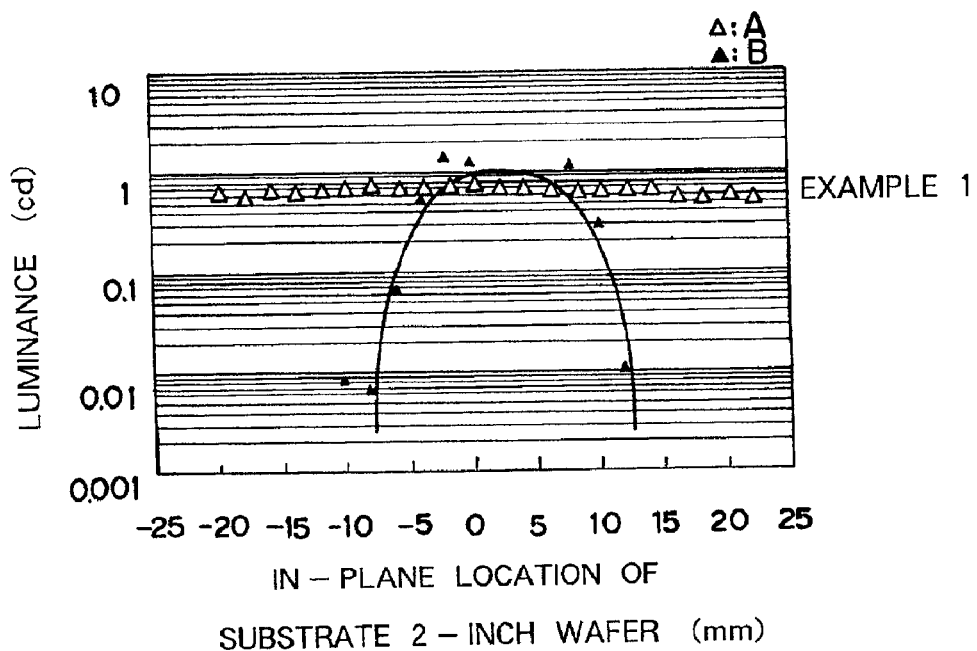
FIG. 7 is a graph showing the relationship between in-plane location and luminance in substrates used to fabricate the light emitting device shown in FIG. 6.

The III–V Group compound semiconductor specimen produced in the foregoing manner was removed from the reactor 2 and annealed for 20 min at 800° C. in nitrogen to make the Mg-doped GaN layer a low-resistance p-type layer. The so-obtained specimen was formed with electrodes by an ordinary process to obtain a light-emitting diode (LED). Ni—Au alloy was used for the p electrode 58 and Al for the n electrode 59. When current was applied to the LED in the forward direction, it exhibited distinct light emission at an emission wavelength of 460 nm. Luminance at the center of the substrate under application current of 20 mA was 0.7 cd. As indicated by the symbols A in FIG. 7, the emission luminance exhibited high uniformity within the substrate plane.

COMPARATIVE EXAMPLE 1

The foregoing Example was repeated in same way, expect that the orifices of the perforated plate of the nozzle unit were formed to a large diameter incapable of establishing a large pressure differential and the substrate was not rotated.

A light-emitting diode was fabricated and current was applied to the LED in the forward direction. As indicated by the symbols B in FIG. 7, the emission luminance exhibited uneven distribution within substrate surface.

Figure 8:
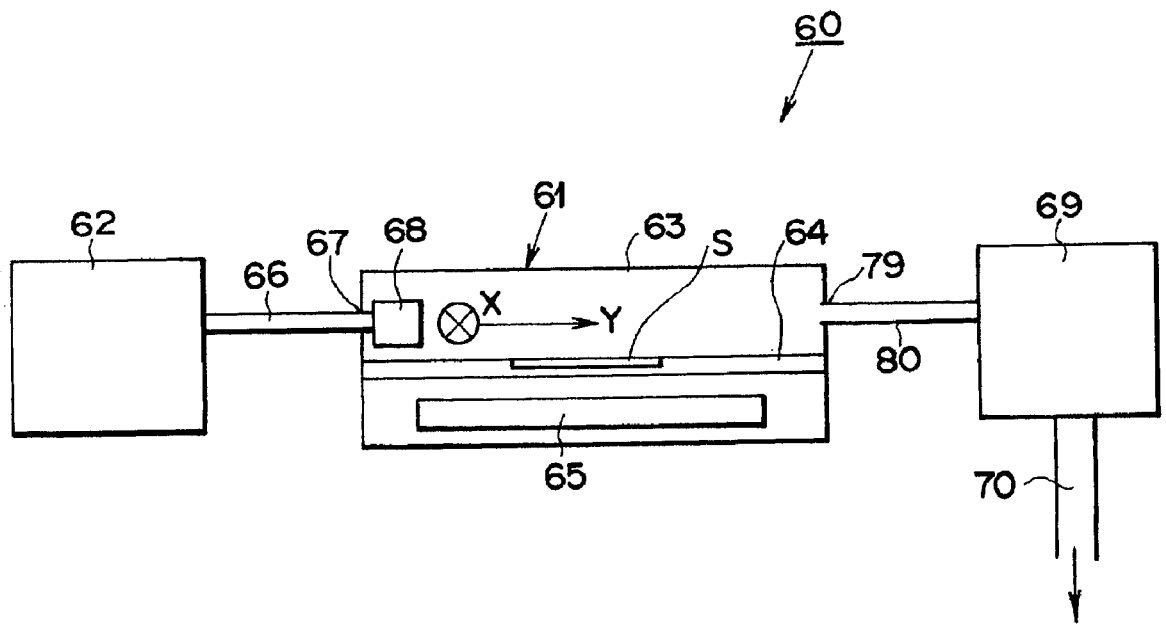
FIG. 8 is a schematic diagram showing a semiconductor manufacturing system that is another embodiment of the present invention.

FIG. 8 is a schematic diagram showing a semiconductor manufacturing system that is an embodiment of the present invention. The semiconductor manufacturing system 60 is a system for manufacturing a suitable compound semiconductor wafer such as, for instance, a GaN-based III–V Group compound (e.g., InGaAlN) semiconductor or a GaAs-based III–V Group compound semiconductor wafer. It is equipped with a reactor 61 and a feed gas supply unit 62 for supplying feed gas to the reactor 61.

The reactor 61 comprises a main body 63 constituted of a quartz tube or the like and a susceptor 64 on which a substrate S is set. The susceptor 64 is heated by a susceptor heating unit 65, such as a high-frequency induction heating coil or an infrared ray lamp, installed inside the main body 63. The susceptor heating unit 65 heats the substrate S set on the susceptor 64 to the desired temperature.

The feed gas supply unit 62 is a conventionally configured unit for supplying the reactor 61 with the feed gas it needs to form a single crystal thin-film layer on the substrate S by MOCVD. The feed gas from the feed gas supply unit 62 is sent through a feed gas supply line 66 to an inlet 67 provided in the main body 63 for receiving the feed gas.

In the main body 63, a lead-in member 68 is provided in connection with the inlet 67 for supplying the feed gas sent to the inlet 67 in the foregoing manner onto the surface of the substrate S at a uniform amount per unit length. The feed gas from the lead-in member 68 is passed in the Y direction in the main body 63, the used feed gas is sent from the reactor 61 to a waste gas treater 69 for treatment, and the treated gas is discharged into the atmosphere from a discharge port 70.

Figure 9:
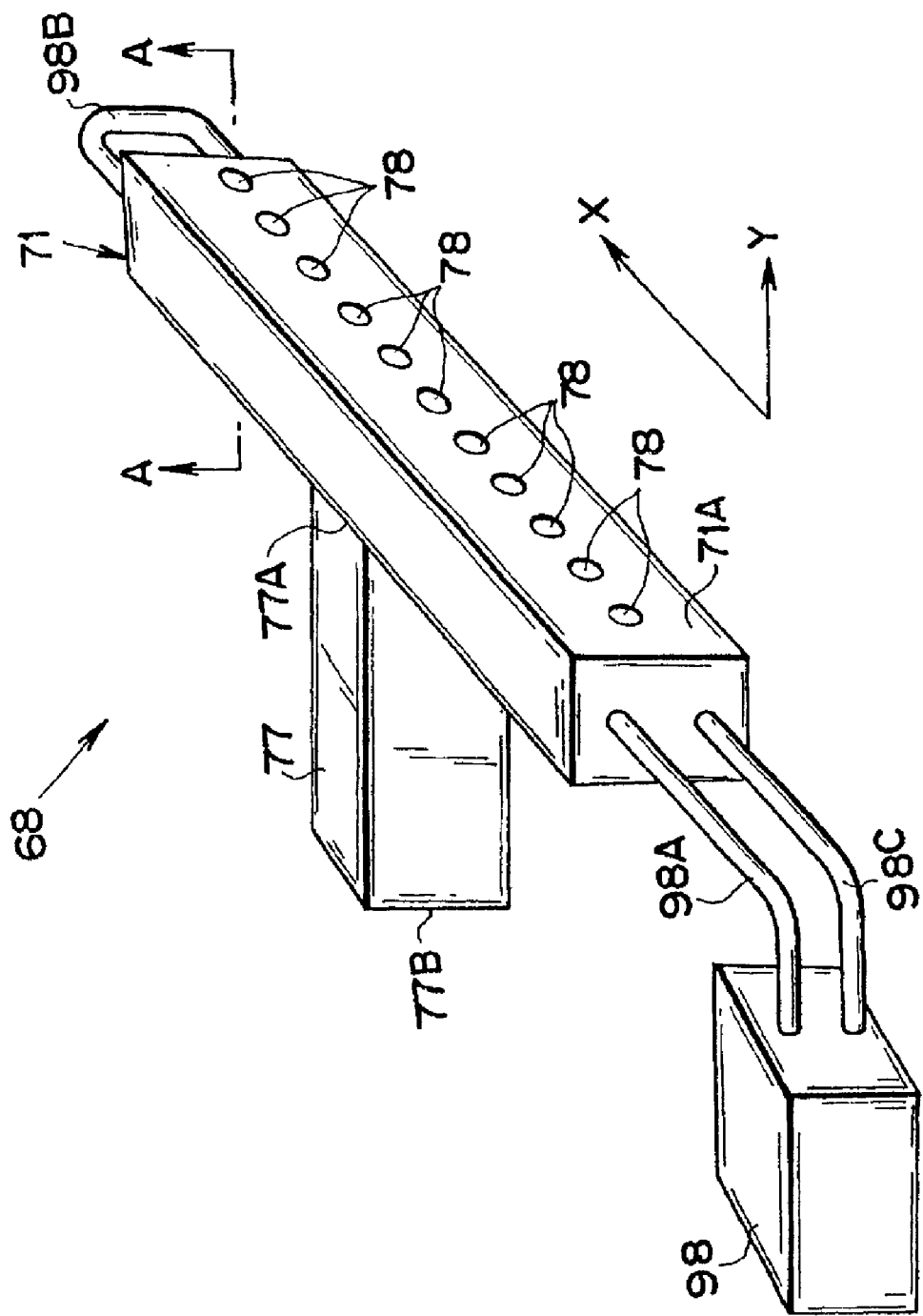
FIG. 9 is an enlarged perspective view of the lead-in member shown in FIG. 8.
Figure 10:
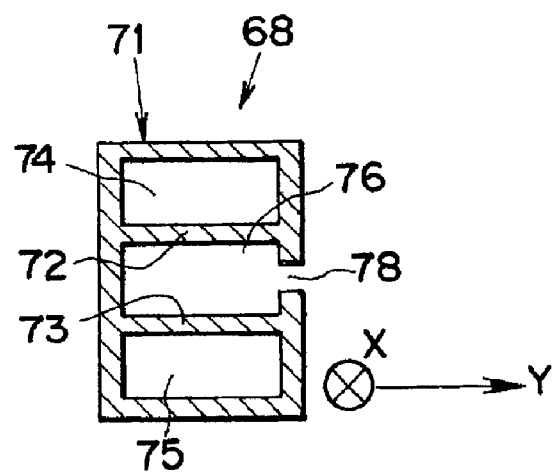
FIG. 10 is a sectional view taken along line A—A in FIG. 9.

The lead-in member 68 will be explained in detail with reference to FIGS. 9 and 10. The lead-in member 68 includes a main body 71 constituted as a hollow bar-shaped member. The interior of the main body 71 is divided into three sections by partitions 72, 73 extending lengthwise within the main body 71, thereby forming an upper coolant passage 74, lower coolant passage 75 and a feed gas guide passage (void-like guide passage) 76.

Reference numeral 77 designates a pipe member for conducting feed gas from the inlet 67 to the main body 71. One end 77A thereof is connected to the main body 71 so as to communicate with the feed gas guide passage 76 of the main body 71 and the other end 77B thereof is connected to the inlet 67. Feed gas supplied into the main body 63 from the inlet 67 is therefore conducted through the pipe member 77 to the feed gas guide passage 76 inside the main body 71.

In order to enable the feed gas conducted into the feed gas guide passage 76 in this manner to be uniformly jetted toward the substrate S from the main body 71 of the lead-in member 68, the front wall 71A of the main body 71 is formed with multiple orifices 78 that communicate the feed gas guide passage 76 with the exterior. The orifices 78 are formed at a prescribed pitch in the axial direction of the main body 71 (direction indicated by the arrow X). In this embodiment, the orifices 78 are formed as fine through-holes of circular cross-section spaced at regular intervals. The feed gas supplied into the feed gas guide passage 76 of the main body 71 in the foregoing manner flows in the X direction within the feed gas guide passage 76 to be jetted from the orifices 78 perpendicularly to the X direction, i.e., in the Y direction, and supplied to the substrate S. The number and pitch of the orifices 78 is defined so as to ensure that the amount of feed gas supplied for film deposition on the substrate S, i.e., the amount of feed gas jetted from the orifices 78, is uniform per unit length in the X direction of the substrate S. As a result, the substrate S can be uniformly bathed in the feed gas jetted from the orifices 78 of the lead-in member 68.

Coolant supplied from a coolant supply unit 98 is circulated through the upper coolant passage 74 and the lower coolant passage 75, thereby constituting a cooling system for controlling the temperature of the main body 71.

In this embodiment, the coolant from the coolant supply unit 98 is sent through a pipe 98A to the upper coolant passage 74, and the coolant passing through the upper coolant passage 74 is sent through another pipe 98B to the lower coolant passage 75. Then, the coolant passing through the lower coolant passage 75 is returned through a pipe 98C to the coolant supply unit 98, and the coolant is again sent to the upper coolant passage 74 after the temperature of the coolant is lowered by passing it through a heat exchanger (not shown). This configuration effectively prevents premature decomposition and other disadvantages that would arise should the feed gas in the feed gas guide passage 76 be heated to a high temperature by the susceptor heating unit 65.

As the semiconductor manufacturing system 60 is structured in the foregoing manner, the lead-in member 68 enables the feed gas from the feed gas supply unit 62 to be supplied onto the surface of the substrate S in a uniform amount per unit length in the X direction. The substrate S is therefore bathed in a uniform feed gas flow that enables highly uniform crystal growth on the surface of the substrate S. Moreover, thanks to the fact that the lead-in member 68 is made capable of cooling the led-in gas by use of a coolant, the temperature of the feed gas can be cooled/controlled so that it does not prematurely decompose while traveling from the inlet 67 to the orifices 78. Since the feed gas can therefore be introduced to the crystal growth site on the substrate S in a fresher state than heretofore, not only is the purity of the crystal formed on the substrate S markedly enhanced but the raw material utilization efficiency is also improved.

The thermally decomposed used feed gas is sent from a discharge port 79 of the main body 63 through a discharge line 80 to the waste gas treater 69.

In the foregoing embodiment, the orifices 78 used to jet the feed gas are formed as holes, namely, fine through-holes. The orifices 78 are, however, not limited to this configuration. One specific configuration usable in place of the through-hole configuration is one formed of a considerably narrow slit. When the orifices 78 are formed as holes (through-holes) the size, spacing, direction etc. of the through-holes can be selected as parameters for adjusting the uniformity of the flow of the feed gas supplied by the main body 71.

Further, the method of arranging the through-holes can be modified from the foregoing arrangement in a single row in the X-direction to an arrangement in two or more rows.

Figure 11:
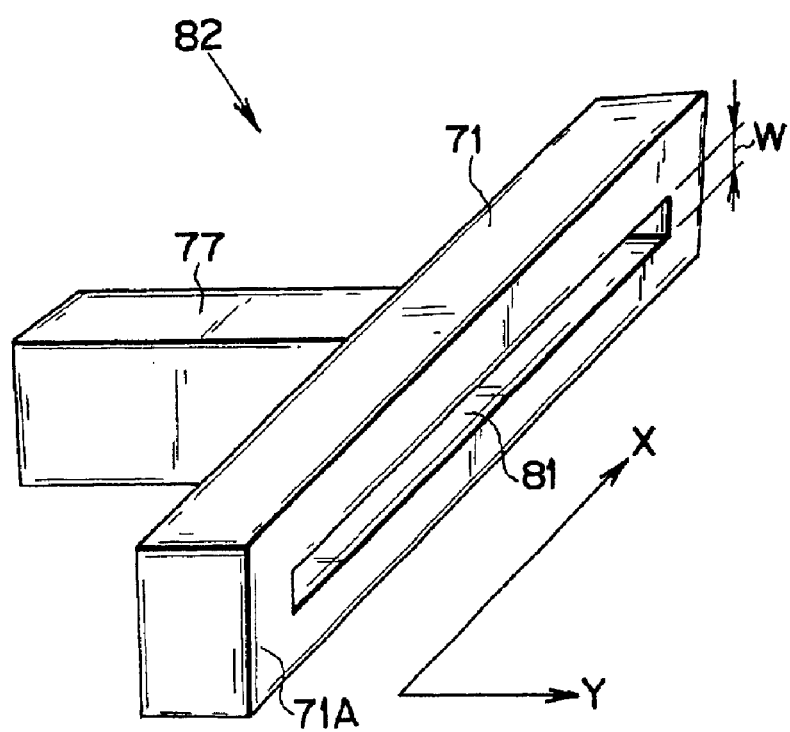
FIG. 11 is a perspective view of a modification of the lead-in member shown in FIG. 8.

FIG. 11 shows a modification of the lead-in member 82 in which the feed gas nozzle is formed as an orifice 81 of slit-like shape. In this case, the slit width W of the orifice 81 need not be uniform in the X direction. The slit width W of the orifice 81 can be appropriately defined as a function of its location in the X direction so as to uniformize the flow of feed gas supplied by the main body 71. Moreover, the number of slits need not be one but can be two or more.

Regardless of whether aperture(s) for jetting gas is/are formed as through-holes or slit(s), the orifices 78 or the orifice 81 can be imparted with a sectional shape that grows progressively wider from the interior toward the exterior, that, to the contrary, grows progressively narrower from toward the exterior, that maintains a constant width from the interior to the exterior, that bulges between the interior and the exterior, or that, to the contrary, is wider at the interior and exterior and narrower in between. In addition, through-hole orifices 78 and slit-like orifice(s) 81 can be provided in combination to function as a gas nozzle.

When the orifices 78 are formed as through-holes, they can be formed in any of various shapes such as circular, triangular or square. However, as shown in FIG. 9, circular orifices are preferable from the point that the through-holes can be formed with good accuracy. The diameter of the through-holes can be decided taking into account such factors as the viscosity and other properties of the feed gas and the amount of the feed gas to be supplied. While the actual diameter of the through-holes depends on the type of feed gas and the flow rate, the inner diameter is preferably 0.01 mm to 5 mm in the case of circular through-holes. When the inner diameter of the through-holes is smaller than 0.01 mm, an adequate degree of processing precision cannot be achieved. When it is greater than 5 mm, it becomes difficult to achieve flow of the feed gas supplied through the through-holes that is uniform in the X direction. In light of these conditions, the inner diameter of the through-holes is more preferably 0.1 mm to 2 mm, still more preferably 0.5 mm to 1 mm.

When the gas nozzle is formed with the slit-like orifice(s) 81, the slit width W can be decided taking into account such factors as the viscosity and other properties of the flow rate of the feed gas. While the actual slit width W depends on the type of feed gas and the flow rate, it is preferably 0.01 mm to 5 mm. When the slit width W is smaller than 0.01 mm, an adequate degree of processing precision cannot be achieved. When it is greater than 5 mm, it becomes difficult to achieve flow of the feed gas supplied from the main body 71 that is uniform in the X direction. In light of these conditions, the slit width W is more preferably 0.1 mm to 2 mm, still more preferably 0.5 mm to 1 mm.

In the foregoing embodiment, the feed gas is supplied from the lead-in member to the reactor through only one set of orifices. Alternatively, however, one or more additional orifice sets can be formed inside the lead-in member and the feed gas be passed through the two or more aperture sets into the reactor. Uniform feed gas flow is easier to achieve with a structure that passes the feed gas through multiple aperture sets.

While various types of gas nozzle structures were explained in the foregoing, in all types, the method used to form the orifice(s) 78, 81 for jetting the feed gas can be selected from among such conventional ones as laser cutting, ultrasonic sound cutting, electron beam cutting, drilling and the like. After formation of the aperture or apertures, it is desirable to polish the cut surfaces of the orifice(s) 78, 81 by electrolytic polishing, mechanochemical polishing or the like, because smoothing of the cut surfaces suppresses discharge of impurities into the feed gas, reaction of the feed gas with the walls of the orifice(s) 78, 81, and other such adverse effects.

In some cases, the raw material constituents react with each other. In such a case, the different raw material constituents should preferably be conducted as close as possible to the substrate S without being mixed. When the lead-in member 68 is used, a separate raw material lead-in member can easily be provided for each raw material constituent. By this, the feed gases can easily be introduced to very near the substrate without mixing. As a result, a semiconductor manufacturing system that capitalizes on the advantages of the present invention can be realized.

Figure 12:
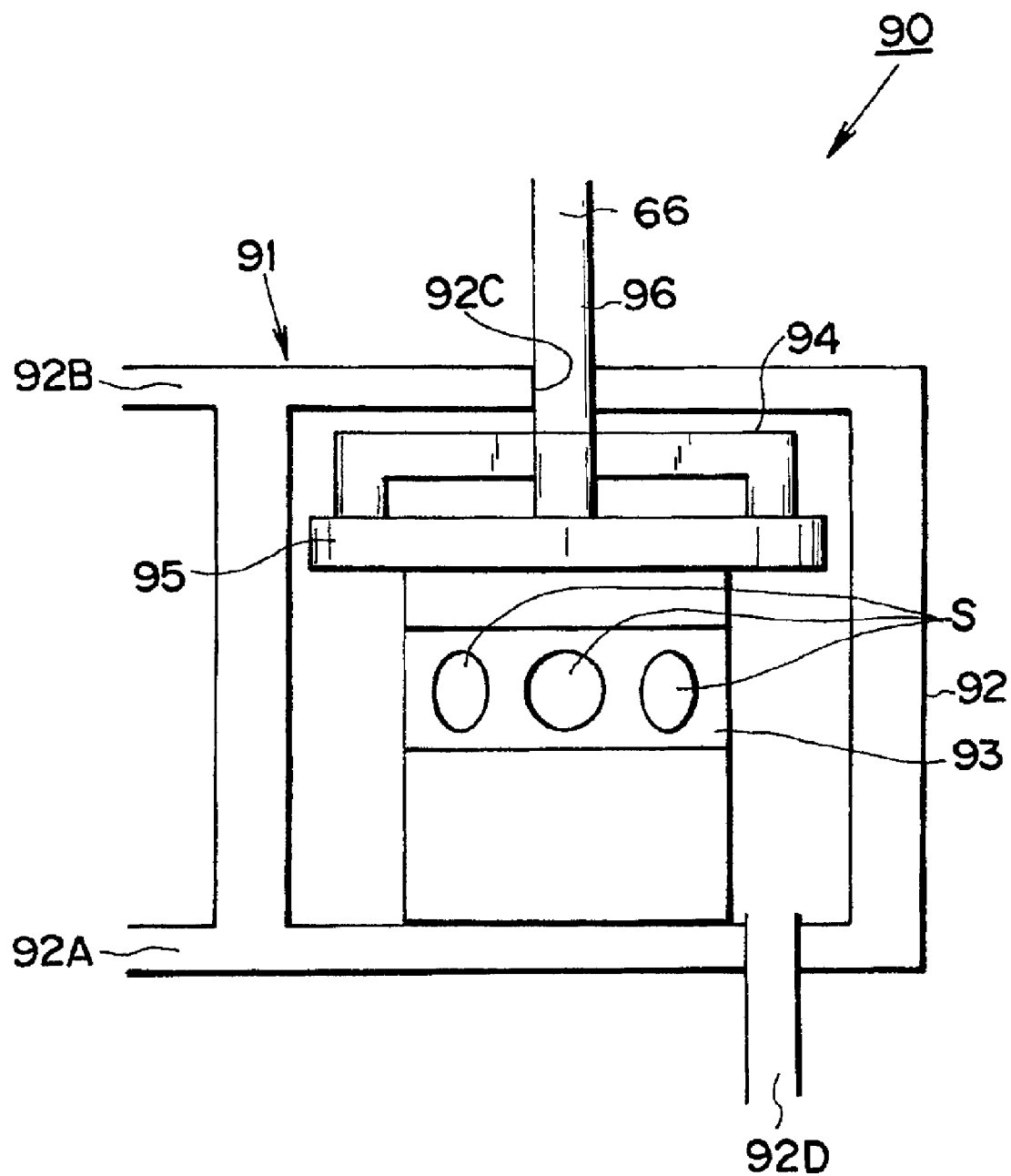
FIG. 12 is schematic view showing a semiconductor manufacturing system that is another embodiment of the present invention.

FIG. 12 shows another embodiment of the present invention. The semiconductor manufacturing system 90 of FIG. 12 is similar to the semiconductor manufacturing system 60 of FIG. 8 except that its reactor 91 has a different structure from the reactor 61. Therefore only the reactor 91 is shown in FIG. 12 and the other constituent elements are omitted.

The reactor 91 is of the vertical type in which substrates S are mounted substantially vertically on a susceptor 93 provided in the main body 92. The main body 92 has a double wall structure and is water cooled. Specifically, coolant supplied through a coolant supply port 92A provided near the bottom of the main body 92 cools the whole outer surface of the main body 92 and is discharged from a coolant discharge port 92B provided near the top of the main body 92. FIG. 12 shows an example in which a plurality of substrates S are mounted on the suscepter 93 at regular spacing.

A lead-in member 94 is connected with an inlet 92C of the main body 92. The lead-in member 94 conducts feed gas arriving from the feed gas supply unit 62 through the raw material supply line 66 into the main body 92 and supplies it along the peripheral surface of the susceptor 93 and onto the surfaces of the substrates S at a uniform amount per unit length so as to form epitaxial crystal layers on the substrates S.

Figure 13:
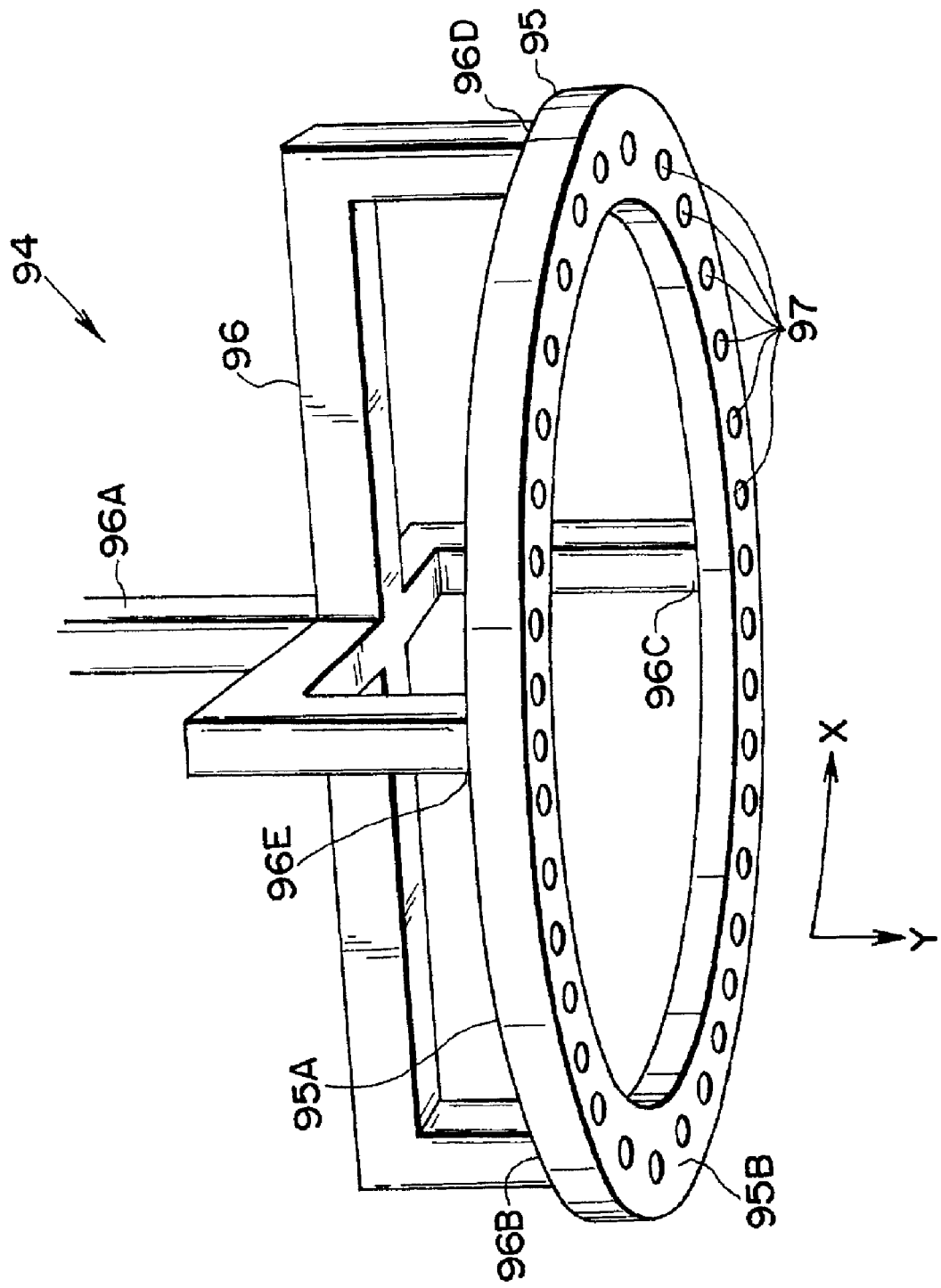
FIG. 13 is an enlarged perspective view of the lead-in member shown in FIG. 12

As illustrated in detail in FIG. 13, the lead-in member 94 comprises a hollow, annular main body 95 and a pipe member 96 for conducting feed gas arriving through the inlet 92C into the main body 95. The pipe member 96 is formed of square pipe material and has an inlet end 96A connected to the inlet 92C. It is equipped on its outlet side with four outlet branches 96B–96E that branch in four directions at 90-degree intervals. The outlet branches 96B–96E are connected to an annual back wall 95A of the main body 95 so as to communicate with an annular void (not shown) formed in the main body 95 to constitute a void-like guide passage for conducting feed gas in the X direction. The pipe member 96 thus conducts feed gas passing from the inlet 92C to the main body 95 into the main body 95 at locations spaced 90 degrees apart in the circumferential direction of the main body 95.

The sectional shape of the pipe member 96 need not necessarily be square but can be appropriately selected from among various suitable shapes. The number of outlet branches need not necessarily be four but any suitable number of outlet branches can be selected and connected to the inlet main body 95. Moreover, while the lead-in member 68, 94 and the associated reactor 61, 91 are fabricated separately in the embodiments shown in FIGS. 8 and 12, the lead-in member 68, 94 can instead be fabricated integrally with the reactor 61, 91 as part of its outer case.

In order to enable the feed gas conducted into the main body 95 in this manner to be uniformly jetted from the main body 95 toward the substrates S, an annular front wall 95B of the main body 95 is formed with multiple orifices 97 for discharging feed gas present in the annular void inside the main body 95 to the exterior in the Y direction perpendicular to the X direction. The multiple orifices 97 are provided in the form of through-holes at a prescribed pitch in the axial direction of the main body 95 (direction indicated by the arrow X). In this embodiment, the orifices 97 are formed as fine through-holes of circular cross-section spaced at regular intervals. The feed gas supplied into the main body 95 in the foregoing manner flows in the circumferential direction (X direction) guided by the annular void in the main body 95 and passes downward (in the Y direction) from the orifices 97 to travel along the surfaces of the substrates S. In other words, the feed gas is discharged from the main body 95 in a direction (Y direction) substantially perpendicular to the feed gas flow direction in the main body 95 (X direction).

The orifices 97 are fine through-holes formed at regular intervals in the circumferential direction of the annular front wall 95B. The number and pitch of the orifices 97 is defined so as to ensure that the amount of feed gas supplied for film deposition on the substrates S, i.e., the amount of feed gas jetted from the orifices 97, is uniform per unit length of every substrate S in the circumferential direction of the main body 95. The substrates S are aligned in parallel with the orifices 97 of the main body 95. As a result, the substrates S can be bathed in the feed gas jetted from the main body 95 of the lead-in member 94.

As the semiconductor manufacturing system 90 is structured in the foregoing manner, the lead-in member 94 enables the feed gas from the feed gas supply unit 62 to be supplied onto the surfaces of the substrates S in a uniform amount per unit length. The substrates S aligned in parallel with the orifices 97 of the lead-in member 94 are therefore bathed in a uniform feed gas flow that enables highly uniform crystal growth on the surfaces of the substrates S. Like the lead-in member 68, the lead-in member 94 is also configured to be capable of cooling the led-in gas by use of a coolant and, therefore, the temperature of the feed gas can be cooled/controlled so that it does not prematurely decompose while traveling from the inlet 92C to the orifices 97. Since this configuration enables the feed gas to be introduced to the crystal growth sites on the substrates S in a fresher state than heretofore, not only is the purity of the crystal formed on the substrates S markedly enhanced but the raw material utilization efficiency is also improved.

The thermally decomposed used feed gas is sent from a discharge port 92D of the main body 92 through the discharge line 80 to the waste gas treater 69.

Examples will now be explained with regard to cases of using a semiconductor manufacturing system configured in accordance with the present invention to form an epitaxial crystal thin film layer on a sapphire substrate and to form an epitaxial crystal thin film layer on a GaAs substrate.

EXAMPLE 2

A number of 50-mm-diameter sapphire substrates were disposed in the reactor 91 of the semiconductor manufacturing system 90 shown in FIG. 12 and the required feed gas was supplied onto the sapphire substrates from the orifices 97 of the lead-in member 94. The growth temperature was set at 550° C. A gallium nitride (GaN) buffer layer was deposited to a thickness of 50 nm using trimethyl gallium (TMG) and ammonia, with hydrogen as the carrier gas.

Supply of TMG was stopped, the temperature was raised to 1060° C., and supply of TMG was resumed to grow GaN. Supply of TMG was discontinued and cooling started immediately upon completion of the deposition. The substrates were rotated and revolved during the growth. When the temperature reached 600° C., supply of ammonia was also stopped. After thorough cooling, the gas in the reactor was replaced with nitrogen and the substrates were removed. All substrates exhibited a mirror surface. The films deposited on the substrates were measured for thickness and evaluated for uniformity. The results are shown in FIG. 14.

Figure 14:
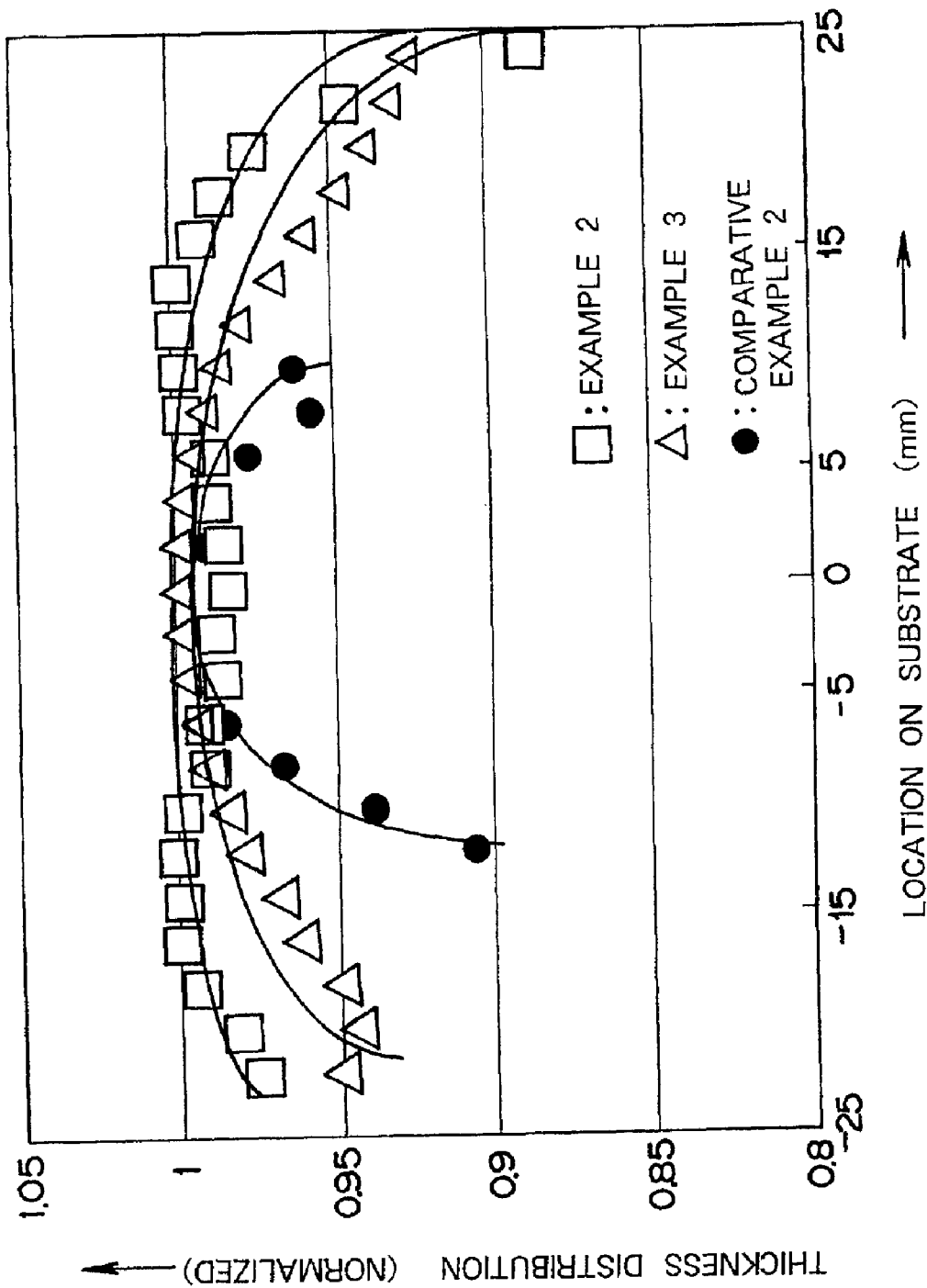
FIG. 14 is a graph showing a measurement result of wafer film thickness distribution in examples fabricated according to the present invention and a comparative example.

The horizontal axis in FIG. 14 represents distance from the center to the edge of the sapphire substrates, and the graph shows normalized film thickness distribution indicative of center-to-edge variation in the thickness of epitaxial crystal growth layers formed on the sapphire substrates.

EXAMPLE 3

A sapphire substrate deposited with GaN beforehand was set in the reactor 61 of the semiconductor manufacturing system 60 shown in FIG. 8 and another GaN layer was grown on the existing GaN layer. The second GaN layer was grown using TMG and ammonia, with hydrogen as the carrier gas. The semiconductor manufacturing system 60 could process only one substrate at a time. The sapphire substrate was rotated during the deposition of the second GaN layer. Upon completion of the deposition, the thickness uniformity of the newly grown portion was evaluated. The results are shown in FIG. 14.

COMPARATIVE EXAMPLE 2

A conventional system was used to grow a GaN layer on a sapphire substrate for comparison with the results of Examples 2 and 3. For this, the lead-in member 68 was removed from the system used in Example 3 and the system was reconfigured to blow the feed gas directly onto the sapphire substrate from above. The sapphire substrate was set horizontally on the susceptor. In other aspects, the configuration and growth conditions were the same as those in Example 2. The uniformity of the thickness of the obtained GaN layer was evaluated. The results are shown in FIG. 14.

It can be seen from the test results shown in FIG. 14 that thickness uniformity of the epitaxial thin film growth layers obtained using the semiconductor manufacturing systems configured according to the present invention was markedly superior to that in case of using the conventional system (Comparative Example 2).

EXAMPLE 4

Figure 15:
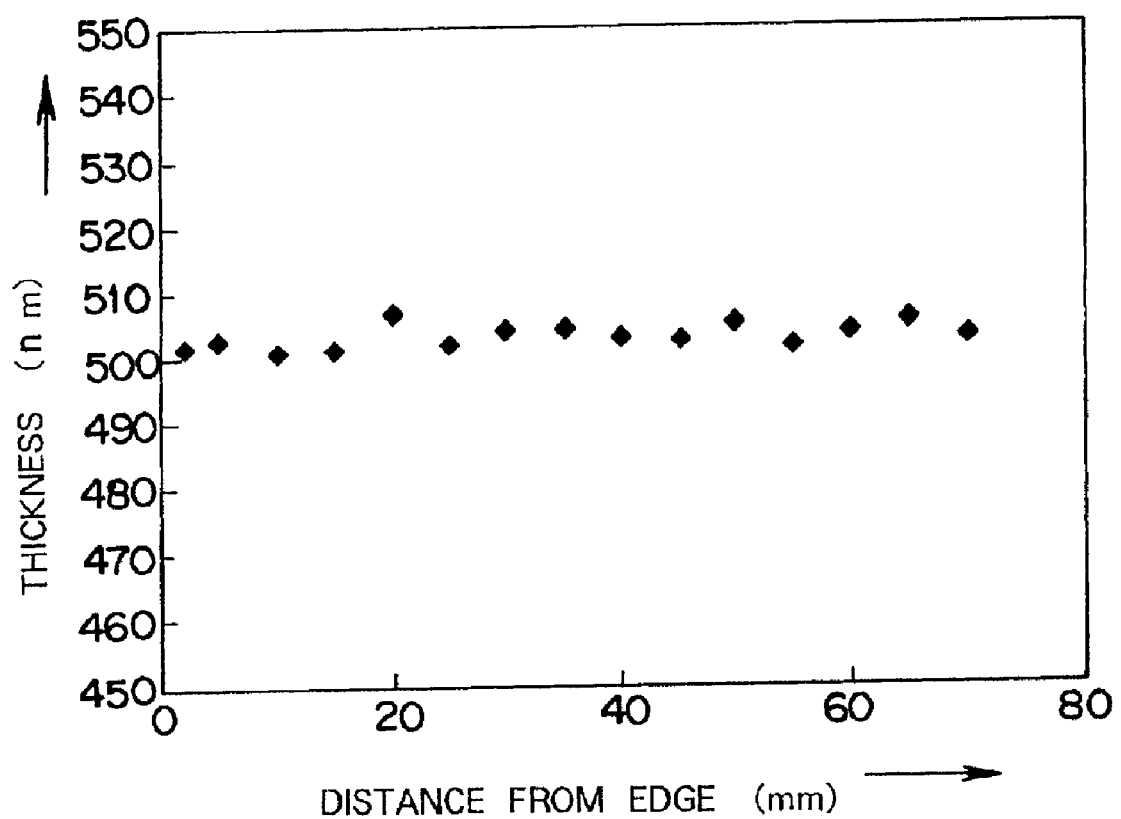
FIG. 15 is a graph showing a measurement result of wafer film thickness distribution in another example fabricated according to the present invention.

Epitaxial thin film layers were grown on a number of 150-mm-diameter substrates set in the semiconductor manufacturing system 90 shown in FIG. 12. Hydrogen was used as the carrier gas and TMG, TMA (trimethyl arsenic) and AsH$_3$ as raw materials. At a temperature of 670° C., an AlGaAs layer (Al: 0.5) was grown on each GaAs substrate to a thickness of 50 nm, whereafter TMG and arsine were supplied to deposit a GaAs layer. After thorough cooling, the gas in the reactor 91 was replaced with nitrogen and the GaAs substrates were removed. A protective film of photoresist was formed on part of each GaAs substrate and only the exposed portion of the GaAs layer was etched with citric acid. The photoresist was then removed with acetone and the height of the step at the portion corresponding to the GaAs layer was measured using a feeler step gauge. The results are shown in FIG. 15. The horizontal axis in FIG. 15 represents distance from the edge to the center of the substrate. It can be seen from FIG. 15 that good in-plane uniformity was obtained.

EXAMPLE 5

Using the semiconductor manufacturing system employed in Example 4, a GaAs and AlGaAs laminated structure of a combined thickness of 1050 nm was grown on a 150-mm-diameter GaAs substrate. On this were then grown a 13-nm InGaAs single quantum well layer (In: 0.15) and a GaAs and AlGaAs layer laminated structure of a combined thickness of 152 nm. After cooling, the gas in the reactor 91 was replaced with nitrogen and the GaAs substrate was removed. The photoluminescence spectrum of the fabricated specimen was measured. The light emission from the InGaAs quantum well was found to have a center wavelength of 984 nm and the in-plane standard deviation of the peak wavelength was 0.75 nm.

EXAMPLE 6

Figure 16:
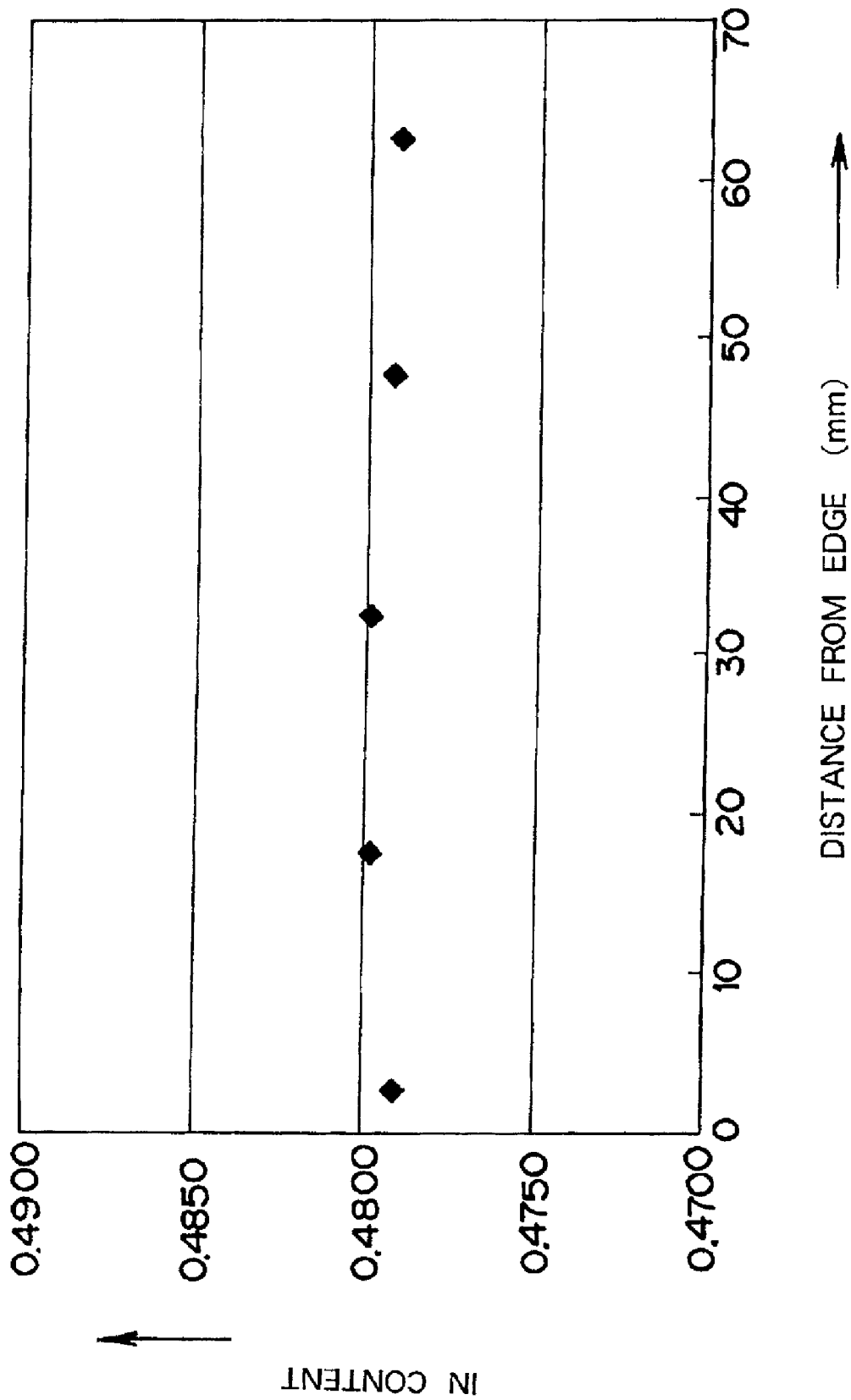
FIG. 16 is a graph showing a measurement result of wafer film thickness distribution in another example fabricated according to the invention.

Using the semiconductor manufacturing system employed in Example 4, a 250-nm InGaP layer was grown on a 150-mm-diameter GaAs substrate at 650° C. using TMG, TMI (trimethyl indium) and phosphine as raw materials. TMG and arsine were then used to grow a 24-nm GaAs layer. After cooling, the gas in the reactor 91 was replaced with nitrogen and the GaAs substrate was removed. The lattice constant was measured by X-ray diffraction and the In component in-plane distribution of the InGaP layer was evaluated. The results are shown in FIG. 16. It can be seen from FIG. 16 that good in-plane uniformity of the In component was obtained.

EXAMPLE 7

Figure 17:
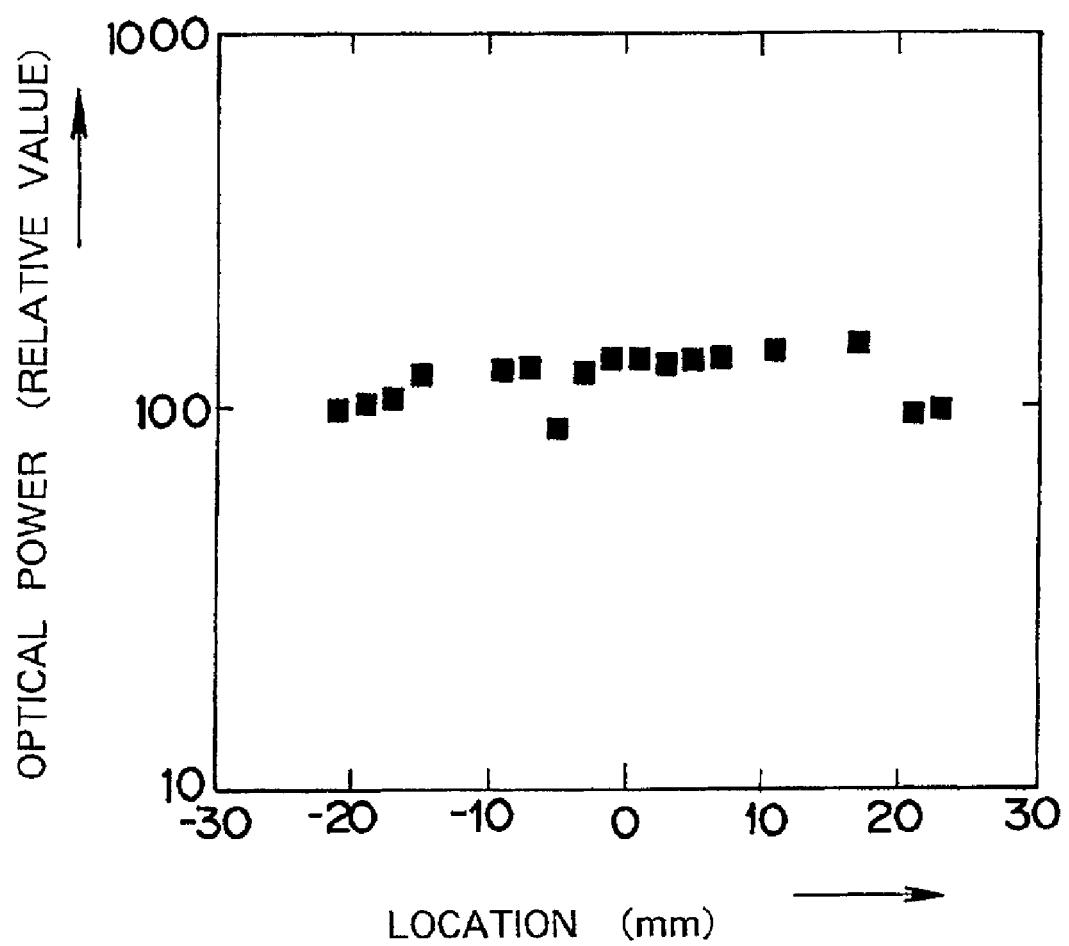
FIG. 17 is a graph showing a measurement result of the optical power distribution of a light-emitting diode fabricated according to the present invention.

Using the system employed in Example 2, a multiple quantum well formed of five repetitions of 3-nm InGaN and 15-nm GaN, an AlGaN layer and a p-type GaN layer were successively fabricated on n-type GaN on a 2-inch sapphire substrate. A light-emitting diode was fabricated from the obtained epitaxial substrate. The optical power was measured under driving at 20 mA in the direction of the substrate diameter. The results are shown in FIG. 17. It can be seen from FIG. 17 that the distribution of the emission power was highly uniform as far as the peripheral region.

As explained in the foregoing, according to the present invention, use of the lead-in member consisting of an appropriate hollow member of bar-like or annular shape and provided with a gas nozzle enables supply of the feed gas onto the semiconductor substrate at a uniform amount per unit length. Thus, by effecting crystal growth with the substrate placed to be bathed in the flow of gas supplied from the nozzle, highly uniform crystal growth can be achieved. Since the lead-in member can be easily cooled and the feed gas supply ports can be brought closer to the crystal growth site than possible with a conventional system, the feed gas can reach the crystal growth site in a fresher state than heretofore, thereby enhancing the crystal purity and improving the raw material utilization efficiency.

Figure 18:
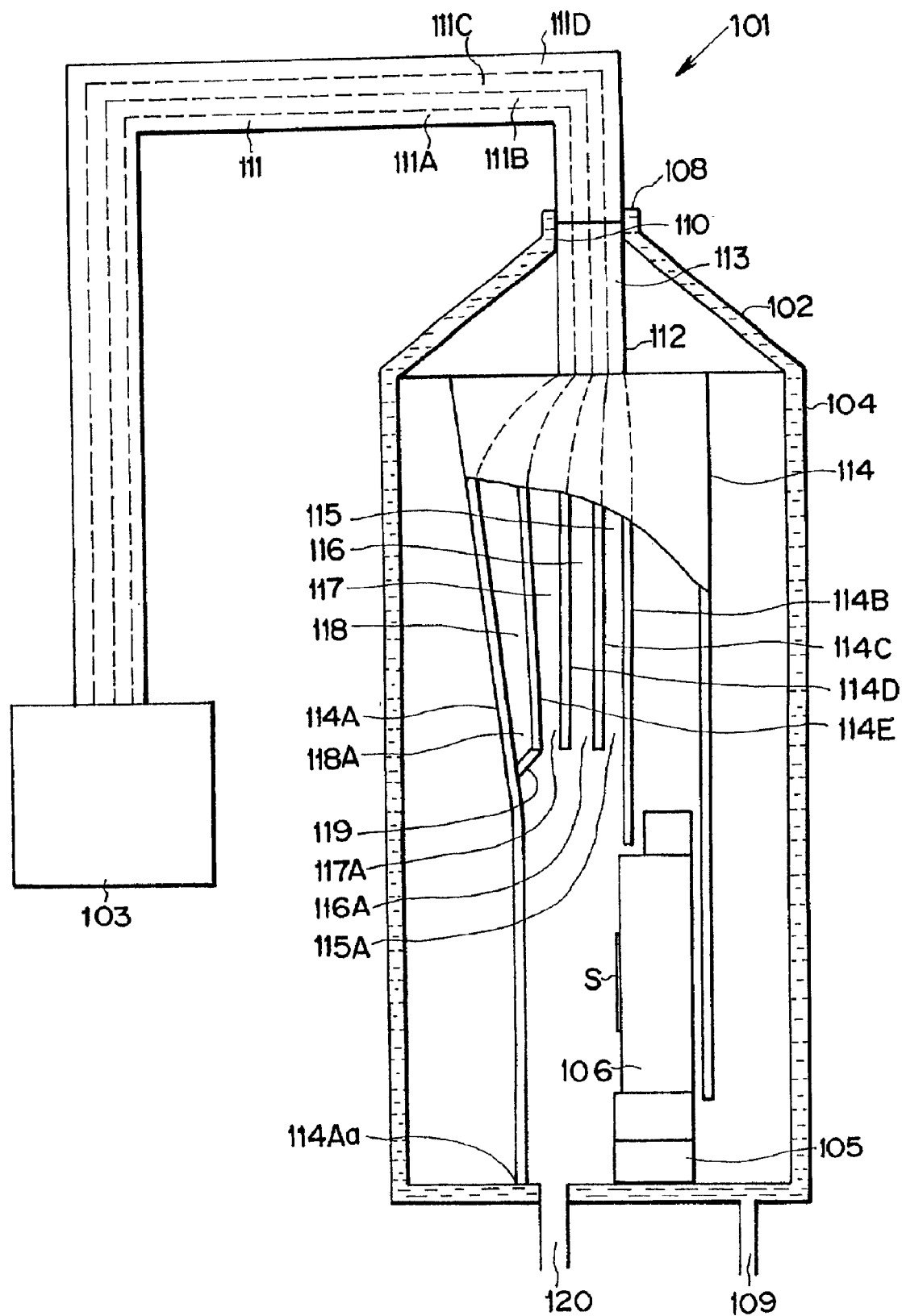
FIG. 18 is a schematic view showing a system for manufacturing semiconductor that is a still further embodiment of the present invention.

FIG. 18 is a schematic view showing a system for manufacturing semiconductor that is an embodiment of the present invention. The semiconductor manufacturing system 101 is a system for manufacturing a suitable compound semiconductor wafer such as, for instance, a GaN-based III–V Group compound (e.g., InGaAlN) semiconductor or a GaAs-based III–V Group compound semiconductor wafer. It is equipped with a reactor 102 and a feed gas supply unit 103 for supplying feed gas to the reactor 102.

The constitution of the feed gas supply unit 103 is essentially the same as that of the unit 3 shown in FIG. 1, while the unit 103 is different from the unit 3 in that each of the feed gases are supplied to the reactor 102 without being mixed. However, as the feed gas supply unit in which each of the feed gases are supplied to the reactor 102 without being mixed are known, the detaile of the feed gas supply unit 103 are not illustrated in FIG. 18.

Figure 19:
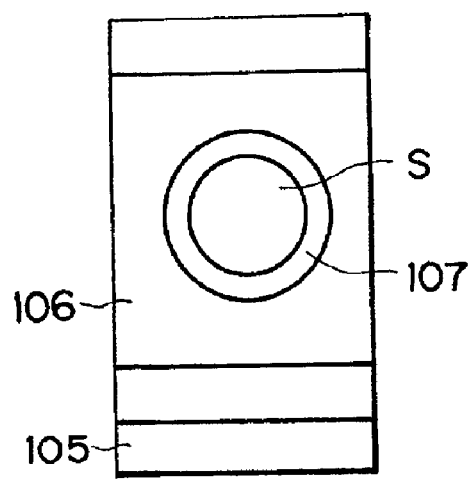
FIG. 19 is a front view of the susceptor of FIG. 18.

The reactor 102 comprises a main unit 104, a stage 105 provided inside the main unit 104 and a susceptor 106 mounted on the stage 105, and a substrate S is attached to the susceptor 106 by a holder 107 (see FIG. 19). The substrate S is heated through the susceptor 106 by an appropriate heat source (not shown) provided inside or outside the susceptor 106, whereby the substrate S can be maintained at the required temperature. The heating can be conducted by an infrared heater or a resistance heater. Otherwise it can be heated by using a high-frequency generator to produce induced current in the susceptor.

Figure 20:
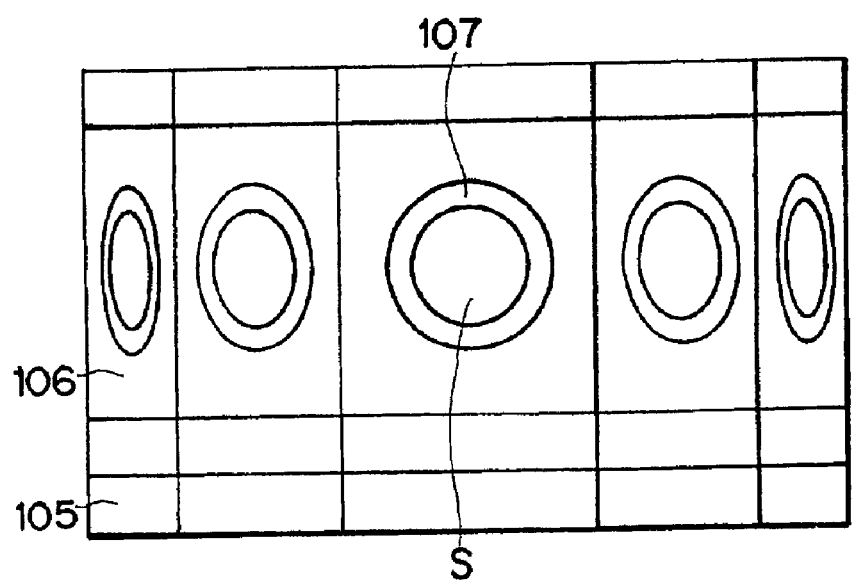
FIG. 20 is a front view of a susceptor capable of processing multiple substrates.

The system shown in FIG. 18 can process only one substrate S at a time. As shown in FIG. 20, however, by adopting a susceptor 106 that is the same as one for a single substrate except for being formed as a polyhedron, as many substrates S as the susceptor polyhedron has faces can be attached. The number of substrates S attached is therefore not limited and a configuration can be adopted that enables mounting of an appropriate number of substrates S. The holder 107 can be provided with a rotating mechanism. When a polyhedron susceptor is adopted, moreover, the stage 105 can be provided with a revolving mechanism for revolving the susceptor as a whole around the center of the polyhedron.

The main unit 104 has a double wall structure and is water cooled. Specifically, coolant supplied through a coolant supply port 109 provided at the top of the main unit 104 cools all or part of the outer surface of the main unit 104 and is discharged from a coolant discharge port 108. In FIG. 18, the passage through which the coolant passes is indicated by hatching.

An inlet port 110 is provided at the top of the main unit 104 for introducing the different gases supplied from the feed gas supply unit 103 into the main unit 104. The feed gas supply unit 103 and inlet port 110 are connected by a supply line 111.

The interior of the supply line 111 is formed with multiple independent passages. A II Group feed gas A, III group feed gas B, V Group feed gas C and blow gas D supplied by the feed gas supply unit 103 are supplied individually to the inlet port 110 through separate passages in the supply line 111. When a IV Group dopant is used, it can either be supplied to the inlet port 110 separately of the other feed gases or be supplied between the feed gas supply unit 103 and the inlet port 110 as mixed with the III Group feed gas. When no II Group dopant is used, a gas such as hydrogen or nitrogen is fed through the II Group feed gas A supply line.

A lead-in device 112 is provided inside the main unit 104 for leading three or more kinds of gas supplied individually to the inlet port 110 in the foregoing manner to the vicinity of the substrate S while maintaining them separate from one another.

The lead-in device 112 is composed of a pipe section 113 and a blow-mix section 114. The pipe section 113 is structured like the supply line 111. It forwards the three or more kinds of gas received from the inlet port 110 to the blow-mix section 114 while maintaining them separate from one another. The interior of the pipe section 113 is therefore divided into multiple passages.

The blow-mix section 114 is provided with a cylindrical housing member 114A. A partition plate 114B installed inside the housing member 114A forms a passage space in the housing member 114A for leading feed gases exiting from the pipe section 113 to the vicinity of the substrate S. Within the passage space formed by the housing member 114A and the partition plate 114B are installed appropriately spaced dividers 114C, 114D, 114E that establish four passages 115, 116, 117, 118. The V Group feed gas C is supplied through the passage 115, the III group feed gas B through the passage 116, the II Group feed gas A through the passage 117, and the blow gas D through the outermost passage 118.

The blow ports 115A, 116A, 117A, 118A of the passages 115, 116, 117, 118 are positioned slightly above the substrate S. The III group feed gas B and the V Group feed gas C are blown along the substrate S in a stratified stream.

A perforated plate 119 is installed at the blow port 118A of the passage 118. The perforations of the perforated plate 119 are aimed at an area upstream of the substrate S. The blow gas D exiting from the passage 118 is therefore blown to an area upstream of the substrate S in the manner of a shower by means of the perforated plate 119.

The III group feed gas B and the V Group feed gas C pass between the perforated plate 119 and the substrate S in a stratified stream. When II Group element doping is conducted, a II Group feed gas flows together with these two gases, also in its own stratum. The blow gas D blown shower-like from the perforated plate 119 first mixes with the III group feed gas B and the V Group feed gas C at this time and efficiently blows the resulting mixture of the III group feed gas B and V Group feed gas C onto the surface of the substrate S.

In this embodiment, the distal end 114Aa of the housing member 114A extends to below the substrate S. As the housing member 114A therefore encloses the entire reaction region, the III group feed gas B and V Group feed gas C mixed by the blow gas D efficiently contact the surface of the substrate S to enable efficient deposition of the required thin-film crystal.

Owing to the foregoing configuration, the II Group feed gas A, III group feed gas B and V Group feed gas C experience no side-reaction up to the time they reach the vicinity of the substrate S. The required thin-film crystal can therefore be formed on the surface of the substrate S to have the prescribed composition and thickness. The used gases are discharged through a discharge port 120 and treated in a discharge gas treater (not shown).

Thanks to the use of the blow gas D to blow the individually supplied feed gases, i.e., the II Group feed gas A, III group feed gas B and V Group feed gas C, toward the substrate S in this manner, the individually supplied II Group feed gas A, III group feed gas B and V Group feed gas C are mixed by the blow gas D just before they arrive at the substrate S. This enables an improvement in the deposition rate and also enhances the content of Al, In and other III Group elements aside from Ga in the GaN-based mixed crystal. In the case of conducting II Group element doping, moreover, the dopant incorporation efficiency can be increased without reducing the crystal deposition rate.

The present invention will now be explained in further detail with reference to working examples. However, the present invention is in no way limited to these examples.

The III–V Group compound semiconductor set out below was grown by metalorganic chemical vapor deposition using the semiconductor manufacturing system shown in FIG. 18.

Bis-ethyl-cyclo-pentadienyl-magnesium $((C_2H_5C_5H_4)_2Mg$; hereinafter sometimes called $(EtCp)_2Mg)$ was used as a p-type dopant for Mg doping.

EXAMPLE 8

Sapphire whose C-face had been polished to a mirror finish was washed with an organic solvent and used for the substrates. A susceptor capable of processing a single two-inch substrate was used. It was rotated during film deposition. The reactor and the substrate were first cleaned by feeding in hydrogen chloride gas at 1,100° C. using hydrogen as carrier gas. At completion of cleaning, trimethyl gallium $((CH_3)_3Ga$; hereinafter sometimes called TMG) and ammonia were fed at a substrate temperature of 550° C. to form a GaN buffer layer to a thickness of 50 nm. The substrate temperature was raised to 1,040° C. and TMG and ammonia were supplied to grow a GaN layer to a thickness of 3 $\mu$m. The deposition rate was 50 nm/min.

Thus obtained epitaxial wafer was removed from the reactor after cooling down, and the thickness distribution of GaN layer was measured. Then the wafer was set in the reactor again, and the substrate temperature was elevated to 750° C., in the atmosphere of mixture of nitrogen and ammonia. After reaching the temperature at 750° C., triethyl gallium $((C_2H_5)_3Ga$; hereinafter sometimes called TEG) and ammonia were supplied to grow a GaN layer. The temperature of the TEG bubbler was 27.5° C.

Figure 21:
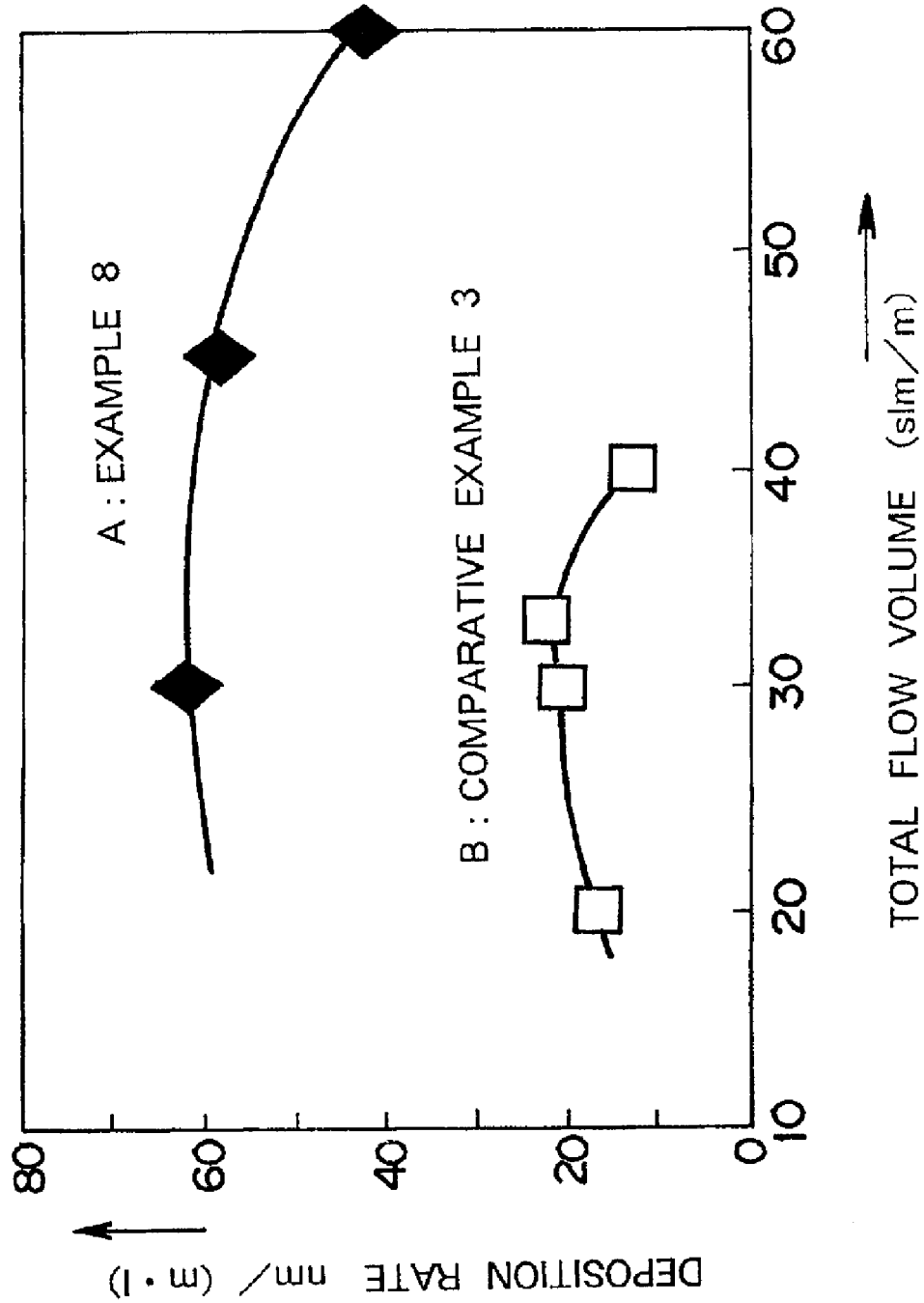
FIG. 21 is a graph showing how GaN layer deposition rate is improved when using the gas supply method of the present invention.

The substrates were removed from the reactor. The total film thickness was measured and the deposition rate of GaN grown at 750° C. was determined by subtracting the thickness of GaN layer grown at 1040° C. This experiment was done several times with changing the total feed gas amount, but the ratio between flow of feed gases kept constant. As indicated by symbols A in FIG. 21, the deposition rate at a total flow volume of 30 slm was 60 nm/min, where the deposition rate was normalized for the amount of the bubbling gas of TEG.

COMPARATIVE EXAMPLE 3

Example 8 was repeated in same way, expect that the perforated plate 119 shown in FIG. 18 was not used.

A GaN layer was grown at 750° C. and the substrate was removed from the reactor. The film thickness was measured and the deposition rate determined. As indicated by symbols B in FIG. 21, the deposition rate at a total flow volume of 30 slm was 20 nm/min, ⅓ the deposition rate when the perforated plate 119 was used. As in Example 8, the deposition rate was normalized for the amount of the bubbling gas of TEG.

EXAMPLE 9

Sapphire whose C-face had been polished to a mirror finish was washed with an organic solvent and used as the substrate. A susceptor capable of processing a single two-inch substrate was used. It was rotated during film deposition. The reactor and the substrate were first cleaned by feeding in hydrogen chloride gas at 1,100° C. using hydrogen as carrier gas. At completion of cleaning, trimethyl gallium TMG and ammonia were fed at a substrate temperature of 550° C. to form a GaN buffer layer to a thickness of 50 nm. The substrate temperature was raised to 1,040° C. and TMG, ammonia were supplied to grow a GaN layer to a thickness of about 3 $\mu$m. The deposition rate was 50 nm/min.

The substrate temperature was lowered to 750° C., the carrier gas was switched to nitrogen, and TEG, TMA and ammonia were supplied to grow an $Al_xGa_{1-x}N$ layer for 1 hr.

The amounts of TMA and TEG were controlled to grow three $Al_xGa_{1-x}N$ layers differing in Al and Ga content ratio.

Figure 22:
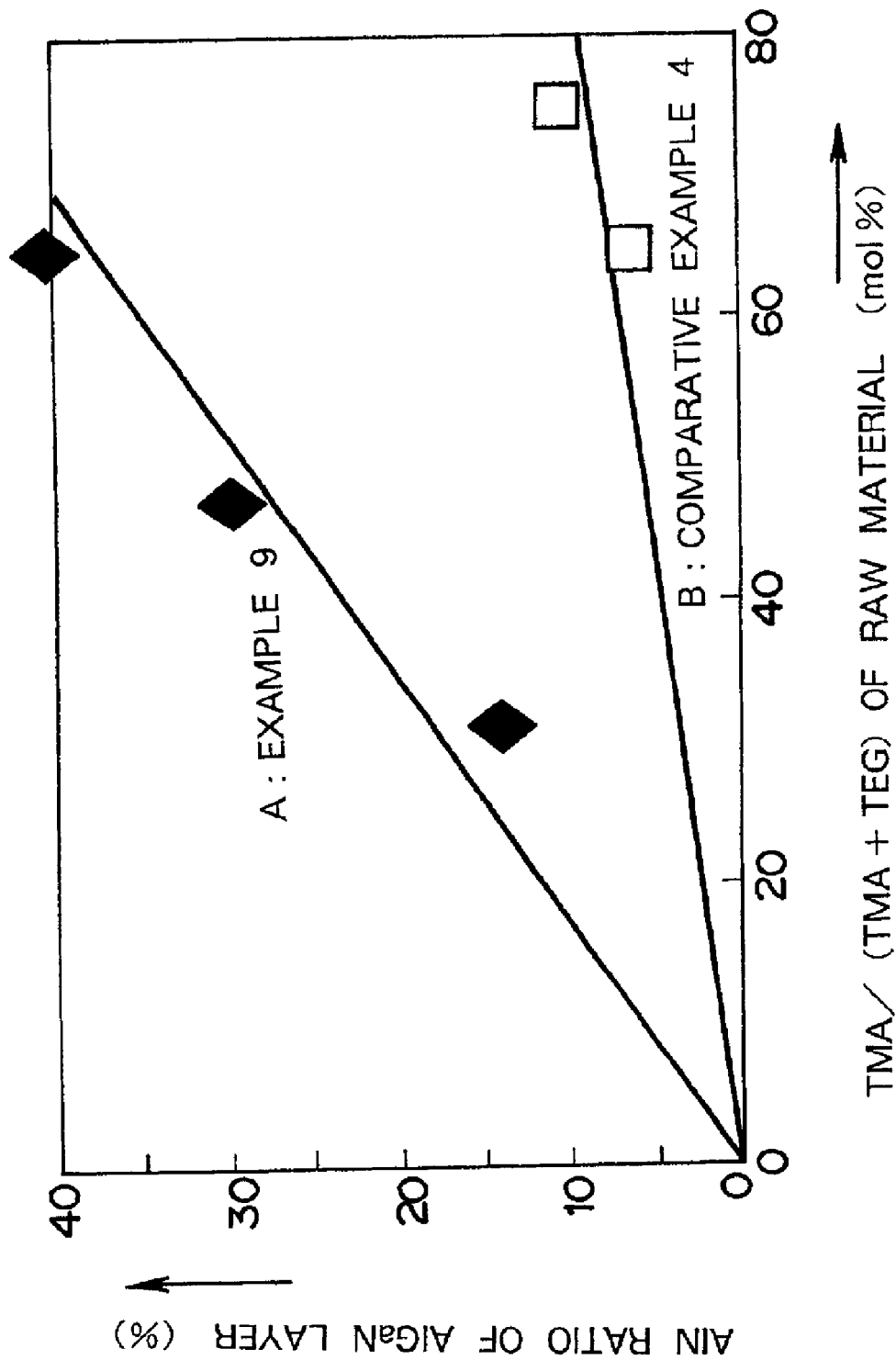
FIG. 22 is a graph showing how the composition of a AlGaN layer is improved when using the gas supply method of the present invention.

After removal from the reactor, each substrate was examined for Al content by X-ray diffraction. As shown by symbols A in FIG. 22, the Al content of the $Al_xGa_{1-x}N$ layers of the substrates increased in proportion to the amount of TMA supplied.

COMPARATIVE EXAMPLE 4

Example 9 was repeated in same way, expect that the perforated plate 119 shown in FIG. 18 was not used.

After growth of the $Al_xGa_{1-x}N$ layer, each substrate was removed from the reactor and examined for Al content by X-ray diffraction. As shown by symbols B in FIG. 22, the Al content of the $Al_xGa_{1-x}N$ layers of the substrates remained substantially unchanged despite the increase in the amount of TMA supplied.

EXAMPLE 10

An epitaxial wafer of 3 $\mu$m thick GaN on sapphire was fabricated by the same way described in Example 8, and the thickness distribution of the GaN layer was measured.

Next, the epitaxial wafer was set in the reactor and the temperature was elevated at 1040° C. in the atmosphere of mixture of hydrogen and ammonia. After reaching the temperature at 1040° C., TMG, $(EtCp)_2Mg$ and ammonia were supplied to grow a GaN layer doped with Mg for 1 hr. The $(EtCp)_2Mg$ supplied was vaporized by bubbling hydrogen at 600 ml/min in the $(EtCp)_2Mg$ bubbler maintained at 30° C.

Figure 23:
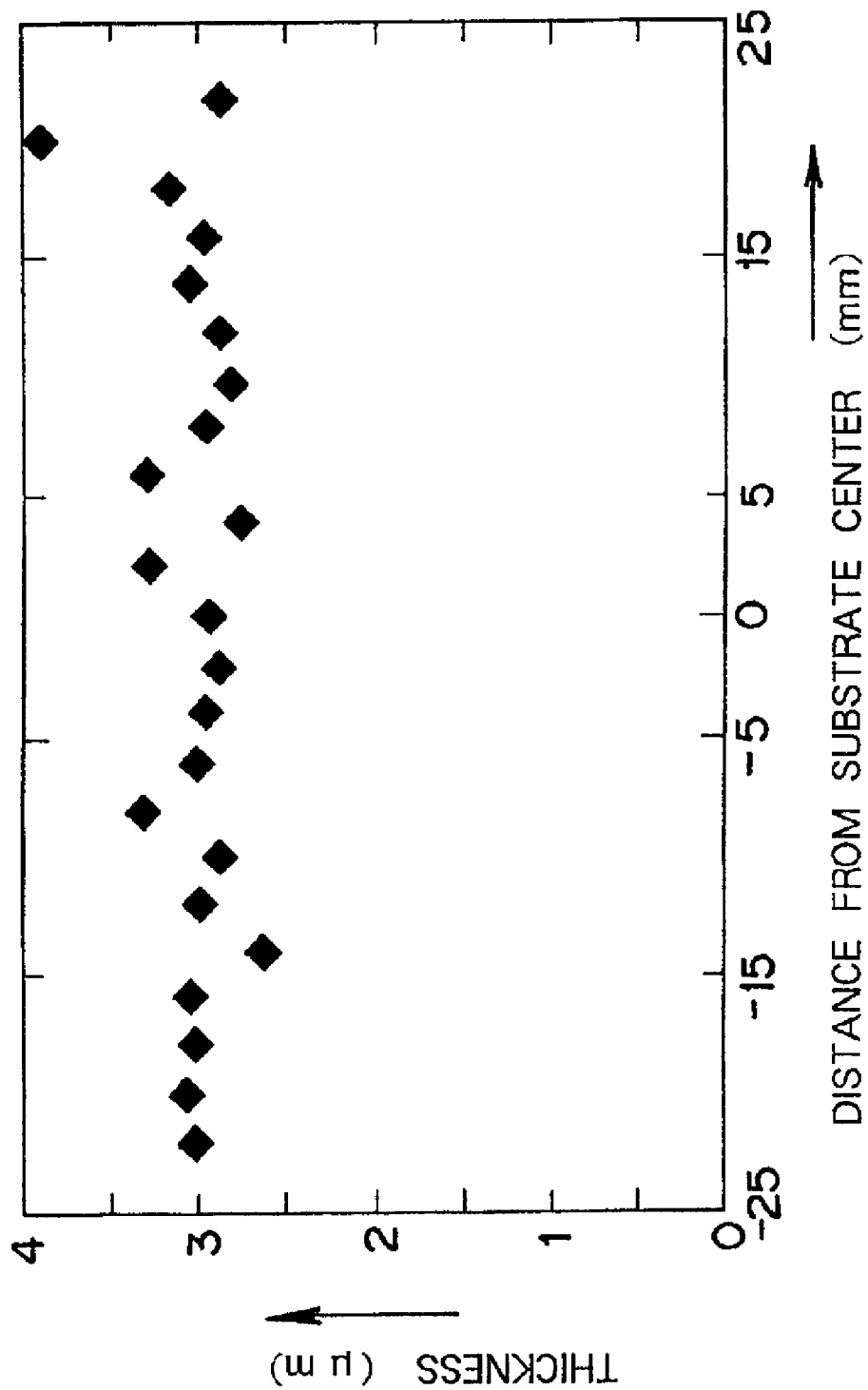
FIG. 23 is a graph showing uniform thickness within the substrate plane of a Mg-doped GaN layer when using the gas supply method of the present invention.

The substrate processed in the foregoing manner was removed from the reactor and the thickness of the Mg-doped GaN layer was measured. As shown in FIG. 23, the 3 $\mu$m GaN layer doped with $1\times10^{19}/cm^3$ of Mg was uniformly deposited within the substrate plane.

COMPARATIVE EXAMPLE 5

Example 10 was repeated in same way, expect that the perforated plate 119 shown in FIG. 18 was not used.

Figure 24:
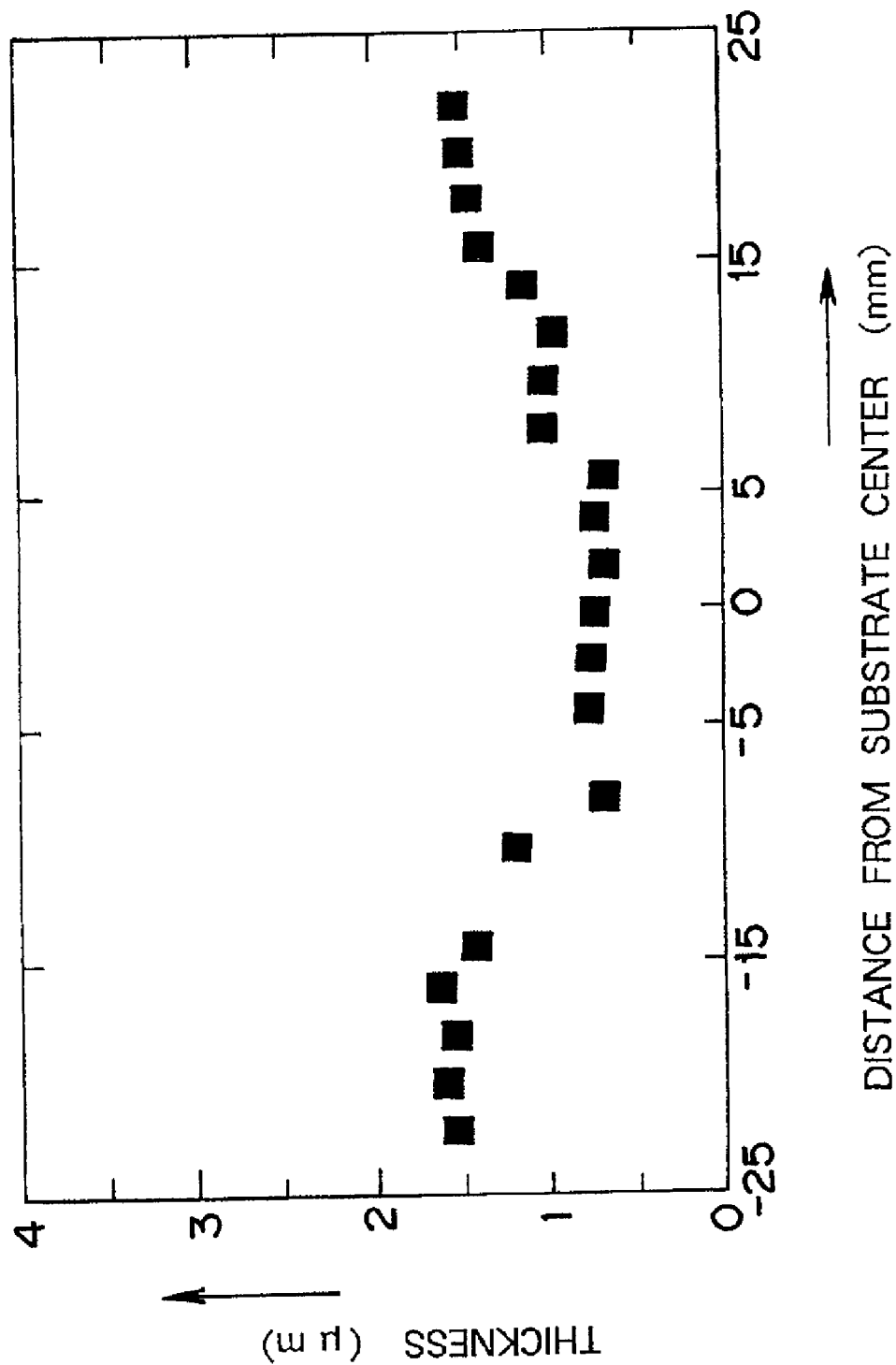
FIG. 24 is a graph showing nonuniform thickness within the substrate plane and decline in deposition rate of a Mg-doped GaN layer when not using the gas supply method of the present invention.

The substrate grown with the Mg-doped GaN layer was removed from the reactor and the thickness of the layer was measured. As shown in FIG. 24, the deposition rate varied within the substrate plane between 0.7 $\mu$m at the center and 1.5 $\mu$m at the periphery. The deposition rate was ½ or less that in Example 10. The GaN layer was doped with $1\times10^{19}/cm^3$ of Mg.

In the present invention, since a blow gas is adopted for blowing the individually supplied feed gases toward the substrate, the multiple individually supplied gases are mixed immediately before arriving at the substrate and make good contact with the substrate surface. This enables an improvement in the deposition rate and also enhances the content of III Group elements in the GaN-based mixed crystal. It also improves doping element incorporation efficiency.

What is claim is:

1. A semiconductor manufacturing system equipped with a reactor and a feed gas supply unit and capable of manufacturing compound semiconductor by an epitaxial vapor deposition process by using a nozzle unit installed in the reactor to discharge feed gas from the feed gas supply unit toward a surface of a substrate mounted in the reactor, the semiconductor manufacturing system being characterized in that:

a pressure differential is produced between the inner side and outer side of a feed gas nozzle member of the nozzle unit by:

at least one baffle plate installed in the nozzle unit; and at least one perforated plate installed in the vicinity of the feed gas nozzle member of the nozzle unit.

2. A semiconductor manufacturing system as set out in claim 1, wherein multiple stages of the pressure differential producing device are provided.

3. A semiconductor manufacturing system as set out in claim 1, wherein the reactor is provided with a cooling system for cooling the peripheral wall portion of the reactor.

4. A semiconductor manufacturing system as set out in claim 3, wherein the reactor is provided with a cooling system for cooling a peripheral wall portion of the reactor.

5. A semiconductor manufacturing system equipped with a feed gas supply unit and a reactor for receiving feed gas from the feed gas supply unit and forming a thin-film crystal layer on a semiconductor substrate by metalorganic chemical vapor deposition, the semiconductor manufacturing system being characterized in comprising:

a lead-in member provided in the reactor for feeding the feed gas received from the feed gas supply unit onto the surface of the semiconductor substrate, which lead-in member includes a void-like guide passage for conducting the feed gas from the feed gas supply unit in a prescribed first direction and a gas nozzle for jetting the feed gas from the void-like guide passage in a second direction substantially perpendicular to the first direction, the semiconductor substrate being bathed in the flow of feed gas from the gas nozzle.

6. A semiconductor manufacturing system as set out in claim 5, wherein the lead-in member is provided with a hollow bar-shaped member wherein the void-like guide passage and the gas nozzle are formed.

7. A semiconductor manufacturing system as set out in claim 5 or 6, wherein the gas nozzle is composed of multiple apertures spaced apart in the first direction.

8. A semiconductor manufacturing system as set out in claim 7, wherein the spacing of the multiple apertures is such that the gas flow formed by the feed gas jetted from the multiple apertures is uniform on the semiconductor substrate.

9. A semiconductor manufacturing system as set out in claim 7, wherein the apertures are formed as through-holes.

10. A semiconductor manufacturing system as set out in claim 5 or 6, wherein the gas nozzle is composed of a slit extending in the first direction.

11. A semiconductor manufacturing system as set out in claim 5, wherein the lead-in member is formed internally with at least one coolant passage for passing a coolant for cooling the feed gas passing through the void-like guide passage.

12. A semiconductor manufacturing system as set out in claim 11, wherein the at least one coolant passage is provided adjacent to the void-like guide passage.

13. A semiconductor manufacturing system as set out in claim 12, wherein two coolant passages are provided adjacent to the void-like guide passage on opposite sides.

14. A semiconductor manufacturing system as set out in claim 5, wherein the lead-in member is provided with a hollow annular member in which the void-like guide passage and the gas nozzle are formed.

15. A semiconductor manufacturing system as set out in claim 14, wherein the gas nozzle is composed of multiple apertures spaced apart in the first direction.

16. A semiconductor manufacturing system as set out in claim 14 or 15, wherein the apertures are formed as through-holes.

17. A semiconductor manufacturing system as set out in claim 15, wherein the spacing of the multiple apertures is such that the gas flow formed by the feed gas jetted from the multiple apertures is uniform on the semiconductor substrate.

18. A compound semiconductor manufacturing system for manufacturing compound semiconductor using any one of the semiconductor manufacturing systems of claim 5, 6, 11, 12, 13, 14, 15, or 17.

19. A method for manufacturing III–V Group compound semiconductors by introducing multiple kinds of feed gas into a reactor in which a substrate on which thin-film crystal layers are to be formed has been mounted and depositing thin-film crystal layers on the substrate by hydride vapor phase epitaxy or metalorganic chemical vapor deposition, which method is characterized in comprising the steps of leading the multiple feed gases to the vicinity of the substrate individually and using a blow gas separately led into the reactor to mix the multiple feed gases present in the vicinity of the substrate and then blow the mixed feed gases toward the substrate.

20. A system for manufacturing III–V Group compound semiconductors that is adapted to introduce multiple kinds of feed gas into a reactor in which a substrate has been mounted and form thin-film crystal layers on the substrate by hydride vapor phase epitaxy or metalorganic chemical vapor deposition, which system is characterized in comprising a lead-in member provided in the reactor for introducing the multiple feed gases into the reactor and leading them to the vicinity of the substrate individually and for leading a blow gas supplied from outside the reactor to the vicinity of the substrate, and a blow member provided at an outlet of the lead-in member for, after the multiple feed gases exiting the lead-in member have been mixed by the blow gas, blowing the blow gas onto the multiple feed gases to blow them toward the substrate.

21. A system for manufacturing III–V Group compound semiconductor as set out in claim 20, wherein the blow member is a perforated plate.

22. A system for manufacturing III–V Group compound semiconductor as set out in claim 20 or 21, further comprising a cooling system for cooling a peripheral wall portion of the reactor with a coolant.

23. A system for manufacturing III–V Group compound semiconductor as set out in claim 20, wherein the lead-in member stratifies the multiple feed gases fed to the vicinity of the substrate.

24. III–V Group compound semiconductor manufactured using the method for manufacturing III–V Group compound semiconductor set out in claim 19.

25. III–V Group compound semiconductor manufactured using the system for manufacturing III–V Group compound semiconductor set out in claim 20 or 23.

26. III–V Group compound semiconductor manufactured using the system for manufacturing III–V Group compound semiconductor set out in claim 22.

* * * * *